US005382506A

United States Patent [19]

Tosaka et al.

[11] Patent Number: 5,382,506

[45] Date of Patent: Jan. 17, 1995

[54] SILVER HALIDE COLOR PHOTOGRAPHIC LIGHT SENSITIVE MATERIAL AND THE IMAGE-FORMING PROCESS THEREOF

[75] Inventors: Yasuo Tosaka; Masayuki Sasagawa, both of Odawara, Japan

[73] Assignee: Konica Corporation, Tokyo, Japan

[21] Appl. No.: 110,083

[22] Filed: Aug. 20, 1993

[30] Foreign Application Priority Data

Aug. 25, 1992 [JP] Japan .................................. 4-226014

[51] Int. Cl.$^6$ .................................................. G03C 7/00

[52] U.S. Cl. ..................................... 430/358; 430/505; 430/508; 430/523; 430/538; 430/557; 430/388

[58] Field of Search ............... 430/358, 505, 508, 523, 430/538, 557, 388

[56] References Cited

U.S. PATENT DOCUMENTS

| | | | |
|---|---|---|---|
| 4,705,745 | 11/1987 | Kitchin et al. | 430/505 |
| 4,814,827 | 3/1989 | Kitchin et al. | 430/505 |
| 4,830,954 | 5/1989 | Matejec | 430/505 |
| 5,075,196 | 12/1991 | Daems et al. | 430/538 |

FOREIGN PATENT DOCUMENTS

| | | |
|---|---|---|
| 0262567 | 4/1988 | European Pat. Off. . |
| 0305599 | 3/1989 | European Pat. Off. . |
| 0459331 | 12/1991 | European Pat. Off. . |
| 2172118 | 9/1986 | United Kingdom . |

*Primary Examiner*—Thomas R. Neville

*Attorney, Agent, or Firm*—Frishauf, Holtz, Goodman & Woodward

[57] ABSTRACT

A silver halide color photographic light sensitive material comprising a support which is both side coated with a polyolefin resin is disclosed. A hydrophilic colloidal layer containing a white pigment and a silver halide emulsion layer are provided on the support and the silver halide emulsion layer contains at least one of the compounds represented by the following Formula I, Formula I

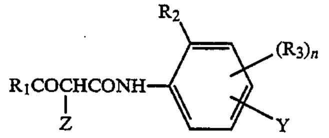

wherein $R_1$ represents an alkyl group, a cycloalkyl group or an aryl group; $R_2$ represents a fluorine atom, an alkyl group, an aryl group, an alkoxy group, an aryloxy group, a dialkylamino group, an alkylthio group or an arylthio group; $R_3$ represents a group substitutable to a benzene ring; n is an integer of 0 or 1; Z represents a hydrogen atom or a group capable of splitting off when coupling it to the oxidized product of a developing agent; and Y represents a monovalent organic group including a ballast group.

9 Claims, No Drawings

SILVER HALIDE COLOR PHOTOGRAPHIC LIGHT SENSITIVE MATERIAL AND THE IMAGE-FORMING PROCESS THEREOF

FIELD OF THE INVENTION

This invention relates to a color photographic light sensitive material and, particularly, to a silver halide color photographic light sensitive material preferably applicable to a color image for proofing use (or, a color proof) prepared of a plurality of black-and-white halftone dot images obtained, in a color plate making printing process, by a color separation and a halftone dot image conversion, and to the color proof making process wherein the color light sensitive material is used.

BACKGROUND OF THE INVENTION

A color image is usually obtained from a color light sensitive material in the following manner. The color light sensitive material is applied with a color reproduction carried out in a commonly applicable subtractive color process. After exposing the light sensitive material to light imagewise, the exposed silver halide grains are developed with a color developer. The resulting oxidized products of a color developing agent is reacted with each of yellow, magenta and cyan dye forming couplers. Then, bleach-fixing and washing or stabilizing treatments are carried out.

For the resulting color images, image quality improvements including, particularly, color reproduction and image sharpness improvements, are essential. For improving the color reproducibility of color light sensitive materials, yellow couplers excellent in color reproducibility are disclosed in Japanese Patent Application Open to Public Inspection (hereinafter referred to as JP OPI Publication) Nos. 2-189543/1990 and 3-9349/1991. The light sensitive materials applied with this type of yellow couplers are excellent in color reproducibility, but have a defect that the black backgrounds cannot be solid. Particularly when fine lines such as black letters are tried to be reproduced, the above-mentioned defect is so serious that image sharpness is deteriorated.

As for the techniques for improving the above-mentioned black background solidness, for example, JP OPI Publication Nos. 53-133432/1978 and 55-59462/1980 disclose the techniques in which the black background reproducibility is tried to be improved by making use of a color photographic light sensitive material provided with a black image forming layer. According to the techniques, black background reproducibility can be improved, but it was found that the techniques have the defects such as an image sharpness deterioration and an unsatisfactory black color reproducibility on fine lines such as black letters.

Besides the above, the techniques for improving an image sharpness, a technique has been disclosed in which an anti-irradiation dye is used and another technique in which black colloidal silver is used. However, these techniques have, for example, a problem of a serious sensitivity deterioration induced thereby, and another problem of a stain which remains on the white background after completing the treatment. For preventing the sharpness deterioration of a reflection type support, JP OPI Publication Nos. 54-46035/1979, 2-28640/1990 and 3-89340/1991 and Japanese Patent Examined Publication (hereinafter referred to as JP Examined Publication) Nos. 59-820/1984 and 2-29203/1990 disclose a proposal for increasing the filling ratios of a white pigment to be contained in the resin-coated layer of a support base, and another proposal for a light sensitive material having a hydrophilic colloidal layer containing a white pigment. It was, however, found that, when an amount replenished is small or with the variations of the processing conditions such as the fatigue of a developer, there arises the problems that a gradation is varied in a toe portion, and that the tone is varied in a high-light portion.

On the other hand, in color plate-making printing processes, an over-lay process, in which a color image is formed by making use of a photopolymer or a diazo compound, and a surprint process are known as a process for obtaining a color proof from a plurality of black-and-white halftone dot images prepared by a color separation and a halftone dot image conversion.

The over-lay process is advantageous, because the operations are very simple, the preparation cost is inexpensive, and the resulting color proof can be used for the proofing purpose only by superposing 4 colored (in the primary colors of subtractive color mixture and in black) film sheets, respectively. However, this process has a defect that the resulting texture becomes different from that of the corresponding printed matter, because a gloss is produced by superposing the film sheets.

The surprinting processes are each to superpose colored images together on a support. As for these processes, the processes in which a colored image is obtained, in a toner development, by utilizing the stickiness of a photopolymerization material, as known from the disclosures in U.S. Pat. Nos. 3,582,327, 3,607,264 and 3,620,726.

As is known from JP Examined Publication No. 47-27441/1972 and JP OPI Publication No. 56-501217/1981, a process for preparing a color proof is carried out in the following manner. An image is transferred onto a support by making use of a light sensitive colored sheet. After the image is formed thereon by exposing to light and then by developing it, another colored sheet is laid thereon and the same processes are then repeated.

JP OPI Publication No. 59-97140/1984 are known to disclose a process in which each of colored images is formed on a support upon transfer of the colored images obtained by exposing color-separated films each corresponding to the colored images to light and then by developing them. It is advantageous to utilize a coloring material similar to a printing ink so as to serve as both of a toner for colored sheet use and the coloring agent for forming these images. Therefore, the tones of the resulting color proof closely resembles that of the resulting printed matter.

In these processes, however, images have to be superposed together and transferred in the color proof preparing step. Therefore, the processes have the defects that it takes a long time to work and that the preparation cost is expensive.

As for the processes capable of solving the above-mentioned defects, there are the processes in which a color proof is prepared by making use of a silver salt color photographic light sensitive material having a white support, as disclosed in, for example, JP OPI Publication Nos. 56-113139/1981, 56-104335/1981, 62-280746/1987, 62-280747/1987, 62-280748/1987, 62-280749/1987, 62-280750/1987 and 62-280849/1987.

In the above-mentioned processes, a color original is converted into the color-separated halftone dot images to prepare a plurality of color-separated black-and-white halftone dot images. The resulting halftone dot images are printed one after another on a sheet of color paper in a method such as a contact printing method and the printed color paper is color developed. A color image is formed of the dye imagewise produced of the couplers, by the color development. The resulting color image is then used as an image for proofing use.

However, the above-mentioned techniques have the defect that the halftone dot reproducibility is liable to be varied particularly in an image region where a narrow halftone dot area is small. Particularly in the case of varying the conditions for the development process, the above-mentioned variations become serious and, therefore, the improvements thereof have been demanded.

When simply making use of the light sensitive material having a hydrophilic colloidal layer containing the white pigment, described in the foregoing JP Examined Publication No. 2-29203/1990, as a light sensitive material for proofing use, it was further found that the small dot reproducibility is deteriorated, in a region where the halftone dot area is small, when the light sensitive material is subject to a running treatment or a fresh sample preservation.

SUMMARY OF THE INVENTION

It is, accordingly, an object of the invention to provide a silver halide color photographic light sensitive material improved on color reproducibility, fine line reproducibility and image sharpness, small in processing solution replenishment, or improved on gradation variation and on highlight color variation even if making use of a fatigued developer.

Another object of the invention is to provide a light sensitive material for color proofing use capable of obtaining a stabilized tone image improved on small dot reproducibility deterioration produced in the development conditions, a running treatment or a fresh sample preservation, in the case where a color proof is prepared of a halftone dot information converted from color-separated and halftone dot images, by making use of a silver halide color photographic light sensitive material; and to the process for preparing the color proof by making use of the above-mentioned light sensitive material for color proofing use.

The above-mentioned objects of the invention can be achieved in the following constitution.

(1) A silver halide color photographic light sensitive material having a hydrophilic collidal layer containing a white pigment and a silver halide emulsion layer each arranged onto one side of a reflection type support provided with polyolefin resin-coated layers onto the both sides of the base of the support, wherein at least one of the silver halide emulsion layers contains at least one of the compounds represented by the following Formula (1).

Formula (1)

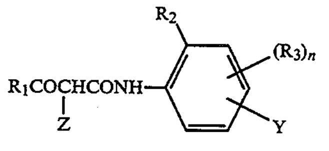

wherein $R_1$ represents an alkyl group, a cycloalkyl group or an aryl group; $R_2$ represents a fluorine atom, an alkyl group, an aryl group, an alkoxy group, an aryloxy group, a dialkylamino group, an alkylthio group or an arylthio group; $R_3$ represents a group substitutable to a benzene ring; n is an integer of 0 or 1; Z represents a hydrogen atom or a group capable of splitting off when coupling it to the oxidized product of a developing agent; and Y represents a monovalent organic group including, preferably, a ballast group.

(2) A silver halide color photographic light sensitive material having a hydrophilic colloidal layer containing a white pigment, a yellow image formable silver halide emulsion layer, a magenta image formable silver halide emulsion layer, cyan image formable silver halide emulsion layer and a black image formable silver halide emulsion layer, each arranged onto one side of a reflection type support provided with polyolefin resin-coated layers onto the both sides of the base of the support.

(3) A color proof making process comprising exposing to light and then processing a silver halide color photographic light sensitive material according to halftone dot image information consisting of color-separated yellow, magenta, cyan and black image information, and making a color proof by forming each of yellow, magenta, cyan and black image components, wherein the silver halide color photographic light sensitive material is as claimed in claim 1 or 2.

DETAILED DESCRIPTION OF THE INVENTION

Now, the invention will be detailed below.

The white pigments applicable to the invention include, for example, a rutile type titanium dioxide, an anatase type titanium dioxide, barium sulfate, barium stearate, silica, alumina, zirconium oxide and kaolin. Among them, titanium dioxide is preferably used from the various reasons. The white pigments may be dispersed in a water-soluble binder made of a hydrophilic colloid such as gelatin so that a processing solution may be permeated into the white pigments. The amounts of the white pigments coated are within the range of, preferably, 1 $g/m^2$ to 50 $g/m^2$ and, particularly, 2 $g/m^2$ to 20 $g/m^2$.

The hydrophilic colloidal layer containing a white pigment relating to the invention is preferable to be interposed between a support and the silver halide emulsion layer closest to the support. Between the support and the silver halide emulsion layer closest to the support, it is also allowed to provide an undercoated layer on the support or a non-light sensitive hydrophilic colloidal layer such as an intermediate layer in any position, if required.

As for the reflection type supports applicable to the invention, it is allowed to use supports each basically made of a base paper laminated with a polyolefin resin on the both side of the base paper.

As for the other reflection type supports applicable to the invention, it is also allowed to use film supports each made of a synthetic resin such as polypropylene, that is coated with a polyolefin resin n the surface thereof.

There is no special limitation to the thickness of the reflection type supports relating to the invention. However, the thickness thereof applicable thereto is, preferably, within the range of 80 to 160 μm.

Next, the couplers applicable to the invention, represented by the afore-given Formula (1), will be detailed.

In Formula (1), the alkyl groups represented each by $R_1$ may be straight-chained or branched. They include, for example, a methyl group, an ethyl group, an isopropyl group, a t-butyl group and a dodecyl group. These alkyl groups further include those having each a substituent. The substituents thereof include, for example, a halogen atom and each of the aryl, alkoxy, aryloxy, alkylsulfonyl, acylamino, alkoxy or hydroxy groups.

The cycloalkyl groups represented each by $R_1$ include, for example, a cyclopropyl, cyclohexyl or adamantyl group.

$R_1$ preferably represents a branched alkyl group.

The alkyl groups each represented by $R_2$ include, for example, the same groups as given for $R_1$. The aryl groups each represented thereby include, for example, a phenyl group. The alkyl and aryl groups each represented by $R_2$ also include those having the same substituents as given in the case of $R_1$.

The groups represented by $R_2$ include, for example, a fluorine atom and an alkoxy group and, preferably, the alkoxy groups.

There is no special limitation to $R_3$, provided that the groups, are each substitutable to a benzene ring. They include, typically, halogen atoms (such as chlorine atom), alkyl groups (such as ethyl, i-propyl and t-butyl groups), alkoxy groups (such as methoxy group), aryloxy groups (such as phenyloxy group), acyloxy groups (such as methylcarbonyloxy and benzoyloxy groups), acylamino groups (such as acetamido and phenylcarbonylamino groups), carbamoyl groups (such as N-methylcarbamoyl and N-phenylcarbamoyl groups), alkylsulfonamido groups (such as ethylsulfonylamino group), arylsulfonamido groups (such as phenylsulfonylamino group), sulfamoyl groups (such as N-propylsulfamoyl and N-phenylsulfamoyl group) and imido groups (such as succinimide and glutarimido groups).

Y represents a monovalent organic group. It is preferable to contain a ballast group therein, provided, however, that it is not limited to the preference when a substituent to $R_2$ contains 8 or more carbon atoms.

In Formula (1), Z represents a group capable of splitting off when making a coupling reaction with the oxidized product of a developing agent and the groups include, for example, those represented by the following Formula (2) or (3).

Formula (2)

$$—OR_{10}$$

In Formula (2), $R_{10}$ represents an aryl or heterocyclic group including those containing each a substituent.

Formula (3)

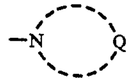

In Formula (3), Q represents a group consisting of the non-metal atoms necessary to form a 5 or 6 membered ring in association with a nitrogen atom, wherein the atomic group necessary to form the group consisting of non-metal atoms include, for example, methylene, methine, substituted methine, $>C=O$, $—NH—$, $—N=$, $—O—$, $—S—$ and $—SO_2—$.

The yellow dye-forming couplers of the invention, represented by the above-given Formula (1), are ordinarily used in an amount within the range of $1\times10^{-3}$ mols to 1 mol and, preferably, $1\times10^{-2}$ mols to $8\times10^{-1}$ mols, each per mol of silver halide to be used.

Next, the typical examples of the yellow couplers represented by the above-given Formula (1) will be given below.

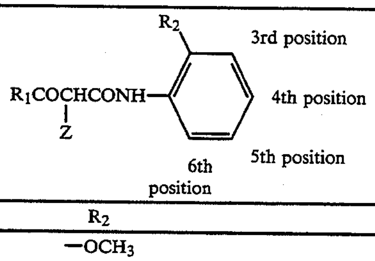

| No. | $R_1$ | $R_2$ | Z |
|---|---|---|---|
| Y-1-1 | $(t)C_4H_9—$ | $—OCH_3$ | 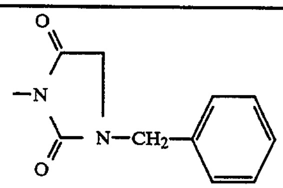 |
| Y-1-2 | $(t)C_4H_9—$ | $—OCH_3$ | 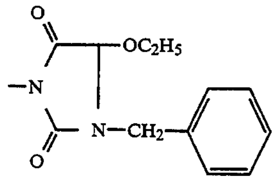 |
| Y-1-3 | $(t)C_4H_9—$ | $—OCH_3$ | 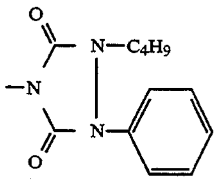 |

-continued
| | | | |
|---|---|---|---|
| | | 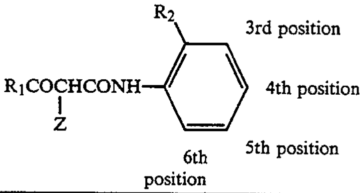 | |
| Y-1-4 | (t)$C_4H_9$— | F | 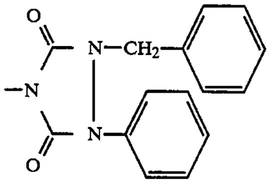 |
| Y-1-5 | (t)$C_4H_9$— | —$OCH_3$ | 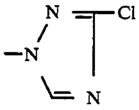 |
| Y-1-6 | (t)$C_4H_9$— | —$CH_3$ | 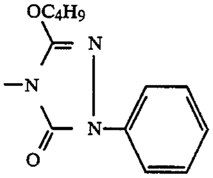 |
| Y-1-7 | (t)$C_4H_9$— | —$OC_3H_7$(iso) | 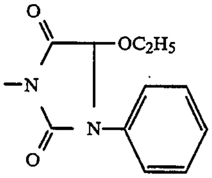 |
| Y-1-8 | (t)$C_4H_9$— | 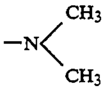 | 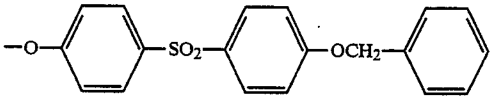 |
| Y-1-9 | (t)$C_4H_9$— | —$OC_{12}H_{25}$ | 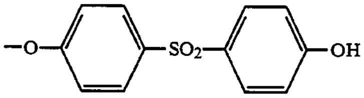 |
| Y-1-10 | (t)$C_4H_9$— | —$OC_{18}H_{37}$ | 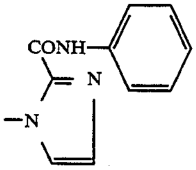 |
| Y-1-11 | (t)$C_4H_9$— | 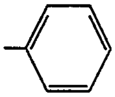 | 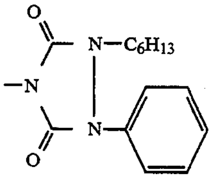 |

-continued
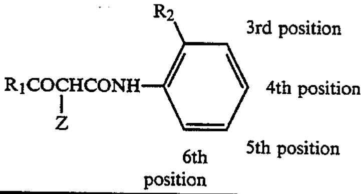
| | | | |
|---|---|---|---|
| Y-1-12 | $(t)C_4H_9-$ | $-OC_4H_9$ | 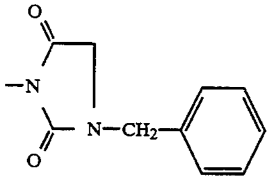 |
| Y-1-13 | $(t)C_4H_9-$ | $-OCH_3$ | 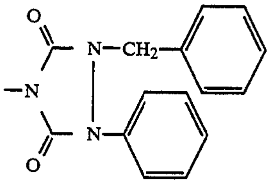 |
| Y-1-14 | $(t)C_4H_9-$ | 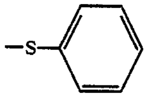 | 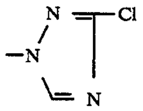 |
| Y-1-15 | $(t)C_4H_9-$ | $-OCH_3$ | 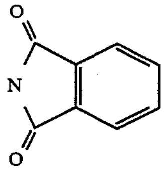 |
| Y-1-16 | $(t)C_4H_9-$ | $-OCH_3$ | 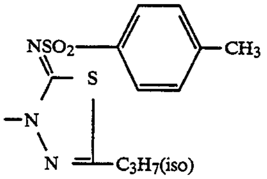 |
| Y-1-17 | 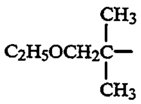 | $-OCH_3$ | 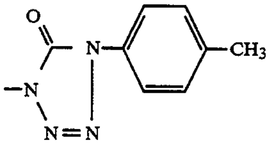 |
| Y-1-18 | $(t)C_4H_9-$ | $-F$ | 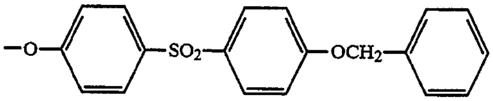 |
| Y-1-19 | $(t)C_4H_9-$ | $-F$ | 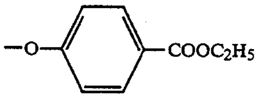 |
| Y-1-20 | $(t)C_4H_9-$ | $-OC_{12}H_{25}$ | 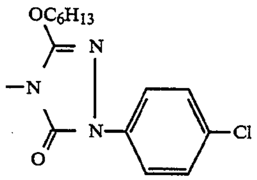 |

-continued
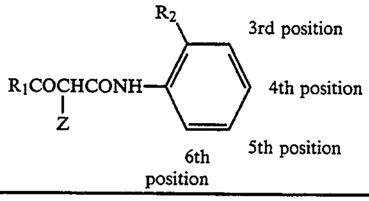
| | | | |
|---|---|---|---|
| Y-1-21 | (t)$C_4H_9$— | —$OC_2H_5$ | 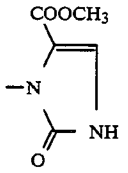 |
| Y-1-22 | 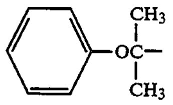 | —$OC_4H_9$ | 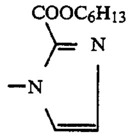 |
| Y-1-23 | (t)$C_5H_{11}$— | —F | H |
| Y-1-24 | (t)$C_4H_9$— | —F | 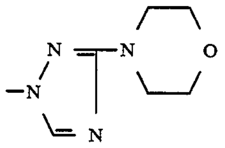 |
| Y-1-25 | (t)$C_4H_9$— | —$OC_{16}H_{37}$ | 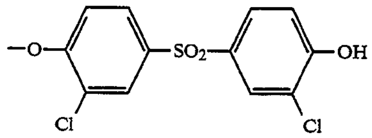 |
| Y-1-26 | (t)$C_4H_9$— | —F | 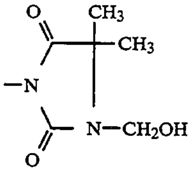 |
| Y-1-27 | (t)$C_4H_9$— | —$OCH_3$ | 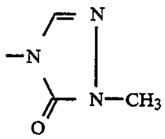 |
| Y-1-28 | (t)$C_4H_9$— | —F | 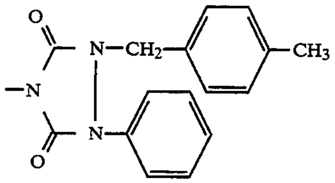 |
| Y-1-29 | 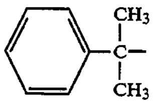 | —$OC_{12}H_{25}$ | 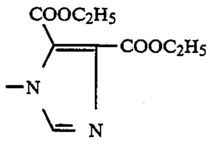 |

-continued
| 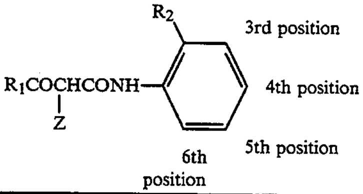 | | | |
|---|---|---|---|
| Y-1-30 | (t)$C_5H_{11}$— | —$SCH_3$ | 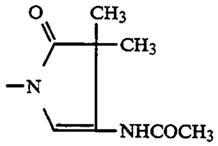 |
| Y-1-31 | (t)$C_4H_9$— | —$OCH_3$ | 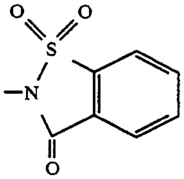 |
| Y-1-32 | (t)$C_4H_9$— | —$OCH_3$ | 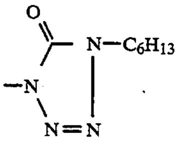 |
| Y-1-33 | (t)$C_4H_9$— | —$OCH_3$ | 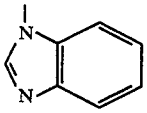 |
| Y-1-34 | (t)$C_4H_9$— | 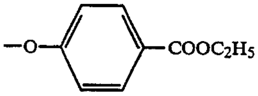 | 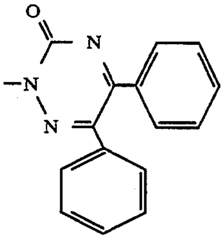 |
| Y-1-35 | (t)$C_4H_9$— | —$OC_4H_9$ | 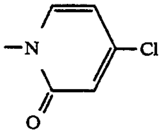 |
| Y-1-36 | (t)$C_4H_9$— | —F | 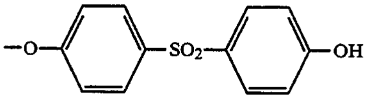 |
| Y-1-37 | (t)$C_4H_9$— | 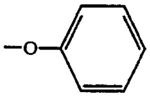 | 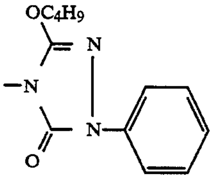 |

-continued
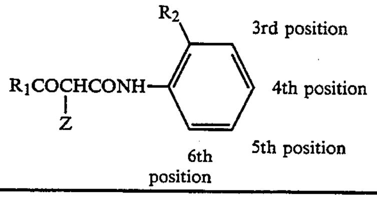
| | | | |
|---|---|---|---|
| Y-1-38 | $(t)C_5H_{11}-$ | $-SCH_3$ | 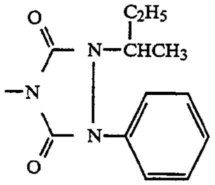 |
| Y-1-39 | $(t)C_4H_9-$ | $-SC_2H_5$ | 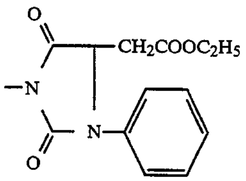 |
| Y-1-40 | $(t)C_4H_9-$ | $-OCH_3$ | 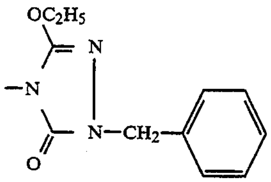 |
| Y-1-41 | $(t)C_4H_9-$ | $-OCH_3$ | 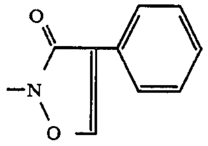 |
| Y-1-42 | $(t)C_4H_9-$ | $-OCH_3$ | 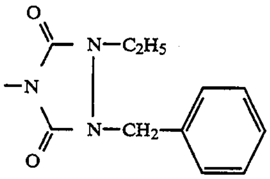 |
| Y-1-43 | $(t)C_4H_9-$ | $-OCH_3$ | 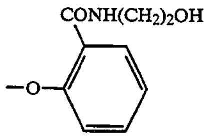 |
| Y-1-44 | 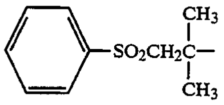 | $-OC_2H_5$ | 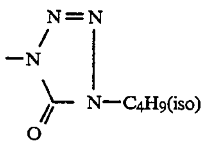 |
| Y-1-45 | $(t)C_4H_9-$ | 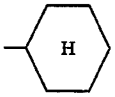 | 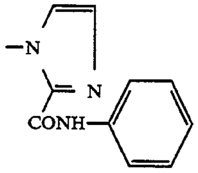 |

-continued
| | | | |
|---|---|---|---|
| | | 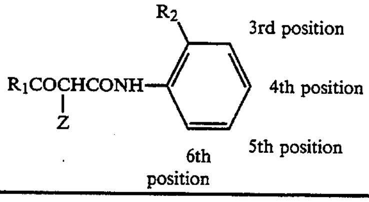 | |
| Y-1-46 | 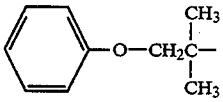 | $-CH_3$ | 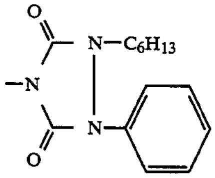 |
| Y-1-47 | $(iso)C_3H_7-$ | $-OC_4H_9$ | 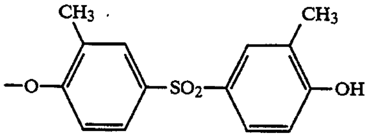 |
| Y-1-48 | 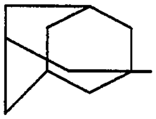 | $-OCH_3$ | 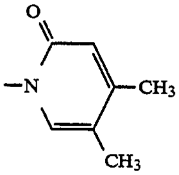 |
| Y-1-49 | 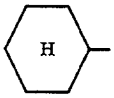 | $-OCH_3$ | 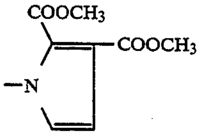 |
| Y-1-50 | $(t)C_4H_9-$ | $-OCH_3$ | 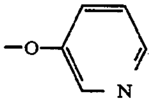 |
| Y-1-51 | $(t)C_4H_9-$ | $-OC_{16}H_{33}$ | 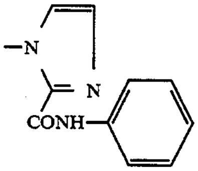 |
| Y-1-52 | $(t)C_4H_9-$ | $-OC_{16}H_{33}(n)$ | 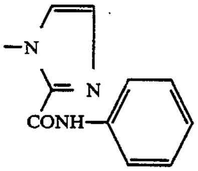 |
| Y-1-53 | $(t)C_4H_9-$ | $-OCH_3$ | 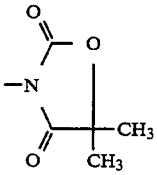 |

-continued
| | | 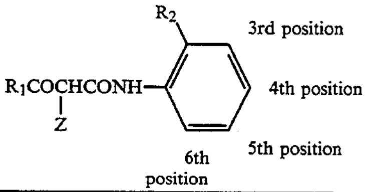 | |
|---|---|---|---|
| Y-1-54 | $(t)C_4H_9-$ | $-F$ | 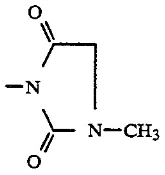 |
| Y-1-55 | $(t)C_4H_9-$ | $-OCH_3$ | 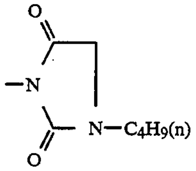 |
| Y-1-56 | $(t)C_4H_9-$ | $-F$ | 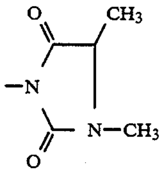 |
| Y-1-57 | $(t)C_4H_9-$ | $-F$ | 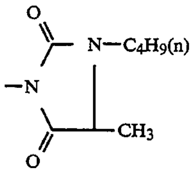 |
| Y-1-58 | $(t)C_4H_9-$ | $-OCH_3$ | 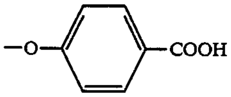 |
| No. | 3rd position | 4th position | 5th position | 6th position |
|---|---|---|---|---|
| Y-1-1 | $-H$ | $-H$ | 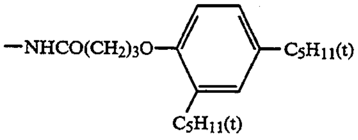 | $-H$ |
| Y-1-2 | $-H$ | $-H$ | 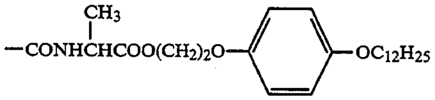 | $-H$ |
| Y-1-3 | $-H$ | $-H$ |  | $-H$ |
| Y-1-4 | $-H$ | $-H$ | 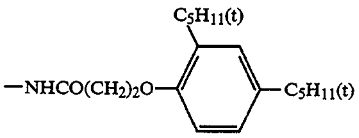 | $-H$ |

-continued
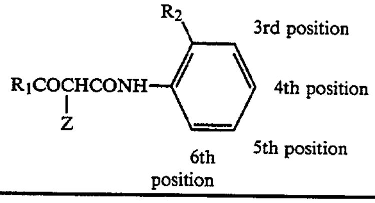
| | | | | |
|---|---|---|---|---|
| Y-1-5 | —H | —H | 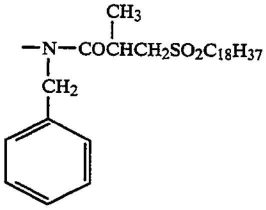 | —H |
| Y-1-6 | —H | —H | 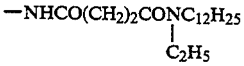 | —H |
| Y-1-7 | —H | —H | 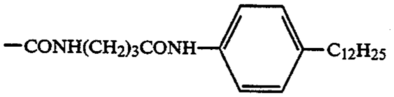 | —H |
| Y-1-8 | —H | —H | 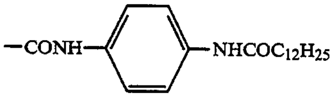 | —H |
| Y-1-9 | —H | —H | 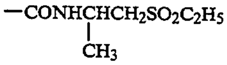 | —H |
| Y-1-10 | —H | —H | 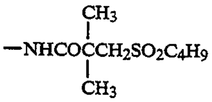 | —H |
| Y-1-11 | —H | —H | 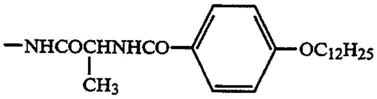 | —H |
| Y-1-12 | —H | —H | 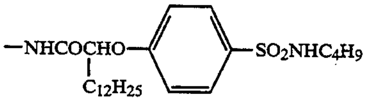 | —H |
| Y-1-13 | —H | —H | $—CONH(CH_2)_2NHSO_2C_{12}H_{25}$ | —H |
| Y-1-14 | —H | —H | 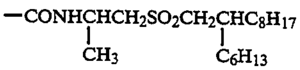 | —H |
| Y-1-15 | —H | —H | 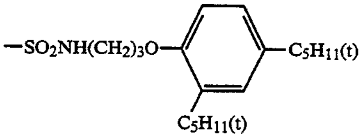 | —H |
| Y-1-16 | —H | —H | 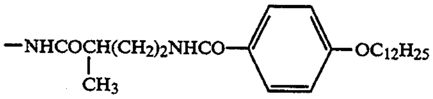 | —H |
| Y-1-17 | —H | —H | $—NHCO(CH_2)_{10}COOC_2H_5$ | —H |

-continued
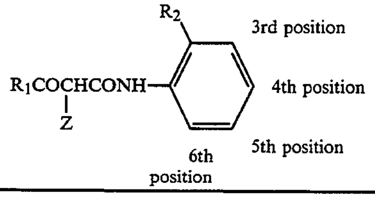
| | | | | |
|---|---|---|---|---|
| Y-1-18 | —H | —H | 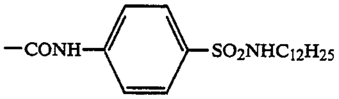 | —H |
| Y-1-19 | —H | —H | 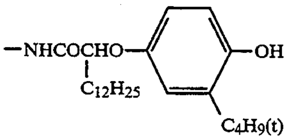 | —H |
| Y-1-20 | —H | —H | 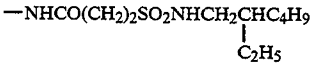 | —H |
| Y-1-21 | 2-H | —Cl | 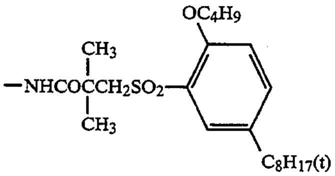 | —H |
| Y-1-22 | —H | —H | $-NHSO_2C_{16}H_{33}$ | —H |
| Y-1-23 | —H | —H | 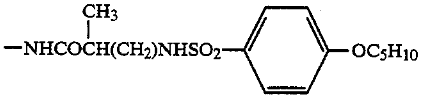 | —H |
| Y-1-24 | —H | —H | 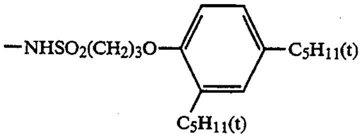 | —H |
| Y-1-25 | —H | —H | 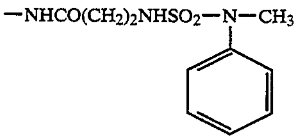 | —H |
| Y-1-26 | —H | —H | 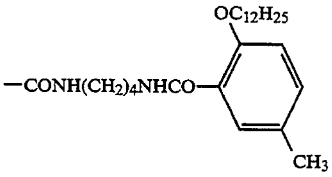 | —H |
| Y-1-27 | —H | —H | 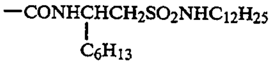 | —H |
| Y-1-28 | —H | —H | $-COOC_{12}H_{25}$ | —H |
| Y-1-29 | —H | —H |  | —H |

-continued
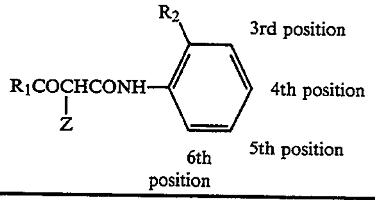
| | | | | |
|---|---|---|---|---|
| Y-1-30 | —H | —H | 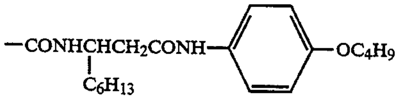 | —H |
| Y-1-31 | —H | —H | $-COOC_{18}H_{35}$ | —H |
| Y-1-32 | —H | —H | $-NHCO(CH_2)_3NHCOCH_2CHC_6H_{13}$<br>$C_8H_{17}$ | —H |
| Y-1-33 | —H | —Cl | 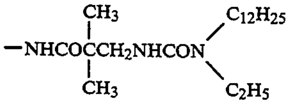 | —H |
| Y-1-34 | —H | —H | 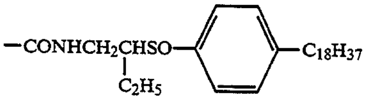 | —H |
| Y-1-35 | —H | $-NHCOCHSO_2NHC_{12}H_{25}$<br>$C_{16}H_{33}$ | —Cl | —H |
| Y-1-36 | —H | —Cl | 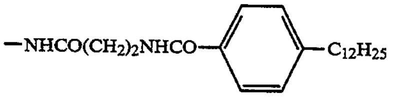 | —H |
| Y-1-37 | —H | —H | 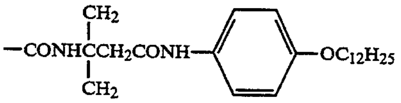 | —H |
| Y-1-38 | —H | $-OCH_3$ | 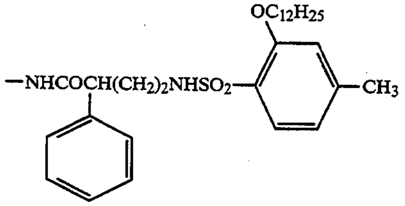 | —H |
| Y-1-39 | —H | —H | $-COOCHCOOC_{12}H_{25}$<br>$CH_3$ | —H |
| Y-1-40 | —H | —H | 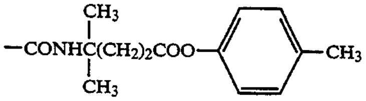 | —H |
| Y-1-41 | —H | $CH_3$<br>$-CONH(CH_2)_4NHSO_2CHC_4H_9$ | $-OCH_3$ | —H |
| Y-1-42 | —H | —H | 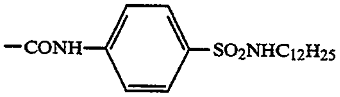 | —H |

-continued
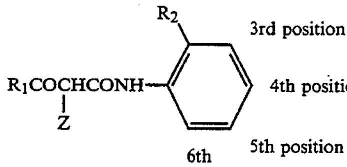
| | | | | |
|---|---|---|---|---|
| Y-1-43 | —H | —H | 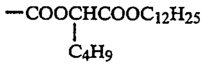 | —H |
| Y-1-44 | —H | —H | 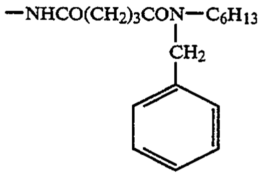 | —H |
| Y-1-45 | —H | —H | 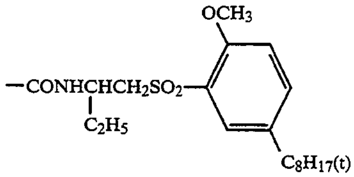 | —H |
| Y-1-46 | —H | —H | 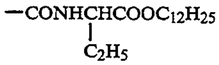 | —H |
| Y-1-47 | —H | —H | 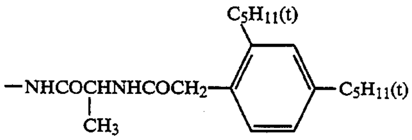 | —H |
| Y-1-48 | —H | —H | $-NHCO(CH_2)_{10}COOC_2H_5$ | —H |
| Y-1-49 | —H | —H | 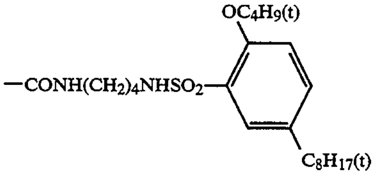 | —H |
| Y-1-50 | —H | —H | 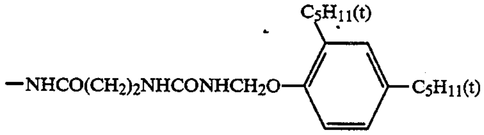 | —H |
| Y-1-51 | —H | —H | $-SO_2NHCOC_2H_5$ | —H |
| Y-1-52 | —H | —H | $-SO_2NHCOC_2H_5$ | —H |
| Y-1-53 | —H | —H | $-COOC_{14}H_{29}$ | —H |
| Y-1-54 | —H | —H | 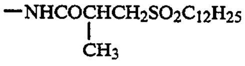 | —H |
| Y-1-55 | —H | —H | 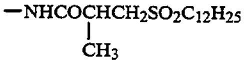 | —H |
| Y-1-56 | —H | —H | 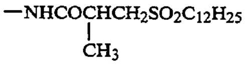 | —H |

-continued

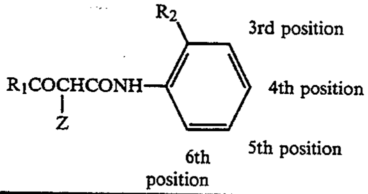

| | | | | |
|---|---|---|---|---|
| Y-1-57 | —H | —H | $-NHCOCHCH_2SO_2C_{12}H_{25}$<br>$CH_3$ | —H |
| Y-1-58 | —H | —H | $-NHCOCHCH_2SO_2C_{12}H_{25}$<br>$CH_3$ | —H |

Besides the above-given examples, it is also preferable to use the compounds represented by Y1 through Y30 given in JP OPI Publication No. 3-209466/1991, pp.11–12.

As for the silver halide emulsions applicable to the invention, it is also allowed to use a silver halide emulsion capable of forming a negative image through a development when making use of a surface-sensitive type emulsion capable of forming a latent image on the grain surface thereof upon making an imagewise exposure. It is further allowed preferably to use a silver halide emulsion from which a positive image can be obtained directly in such a manner that an internal latent-image forming type emulsion unfogged in advance on the grain surfaces thereof is treated to be fogged (or, treated to be granulated) after making an imagewise exposure and is then surface-developed; or it is exposed imagewise and is then surface-developed while it is being treated to be fogged.

The above-mentioned fogging treatment may be carried out in any one of the methods such as an overall exposure, a chemical treatment with the use of a foggant, a treatment with the use of a high energy developer, or a heat treatment. The expression, "an emulsion containing the above-mentioned internal latent image forming type silver halide emulsion grains", means an emulsion having the photosensitive nuclei mainly inside the silver halide crystallized grains thereof and capable of forming a latent image inside the grains upon making an exposure to light.

In the technical field of the above-mentioned internal latent image forming type direct positives, there have been many known techniques including, for example, those described in U.S. Pat. Nos. 2,592,250, 2,466,957, 2,497,875, 2,588,982, 3,761,266, 3,761,276 and 3,796,577 and British Patent No. 1,151,363.

The mechanism for forming a positive image has not still completely cleared. However, "Photographic Science and Engineering" Vol. 20, p. 158, (1976), for example, described as follows.

Photoelectrons are produced inside silver halide crystallized grains by making an imagewise exposure and are then captured selectively to the inside of the grains, so that an internal latent image can be formed. The resulting latent image can work as an effective center for capturing the electrons in a conductive zone. In the grains exposed to light, therefore, the electrons having been injected into a fog-developing step carried out after exposure are captured inside the grains so as to intensify the latent image. In this case, the latent image is not developed on the grain surfaces, because the latent image is inside the grains. With the grains not exposed to light, on the other hand, at least a part of the electrons having been injected thereto are captured on the grain surfaces and the latent image is formed on the grain surfaces. Therefore, the grains are developed in the surface development.

The internal latent image forming type silver halide grains unfogged in advance, which are applicable to the invention, they are the grains of an emulsion capable of forming a latent image mainly inside the silver halide grains thereof and having silver halide grains containing most of the photosensitive nuclei inside the grains. These emulsions include, for example, those containing any silver halides such as silver bromide, silver chloride, silver chlorobromide, silver chloroiodide, silver iodobromide and silver chloroiodobromide.

Among the above-mentioned emulsions, the preferable emulsions are those capable of showing a maximum density obtained in the following first case to be not higher than 1/5 of the maximum density obtained in the following second case. In the first case, a part of an emulsion sample, that is comprised of a transparent support having a coating weight of silver within the range of about 1 to 3.5 g/m$^2$ the part of the sample is exposed to light, through a light intensity scale, extending over a certain time from about 0.1 seconds to about 1 second, and is then developed, at 20° C. for 4 minutes, by making use of the following surface-developer A not substantially containing a silver halide solvent and capable of developing only an image on the grain surfaces. In the second case, another part of the same emulsion sample is similarly exposed to light and an image inside the emulsion grains is developed, at 20° C. for 4 minutes, by making use of the following internal-developer B capable of developing an image inside the emulsion grains.

Further, the particularly preferable emulsions are those capable of showing a maximum density obtained by making use of surface-developer A to be not higher than 1/10 of the maximum density obtained by making use of internal-developer B.

| | |
|---|---|
| (Surface-developer A) | |
| Metol | 2.5 g |
| L-ascorbic acid | 10.0 g |
| Sodium metaborate (tetrahydrate) | 35.0 g |
| Potassium bromide | 1.0 g |
| Add water to make | 1000 ml |
| (Internal-developer B) | |
| Metol | 2.0 g |
| Sodium sulfite (anhydride) | 90.0 g |
| Hydroquinone | 8.0 g |

-continued

| | |
|---|---|
| Sodium bromide (monohydrate) | 52.5 g |
| Potassium bromide | 5.0 g |
| Potassium iodide | 0.5 g |
| Add water to make | 1000 ml |

The internal latent image forming type silver halide emulsions preferably applicable to the invention include those prepared in various processes. For example, they include the following silver halide emulsions; a conversion type silver halide emulsion such as described in U.S. Pat. No. 2,592,250; a silver halide emulsion comprising silver halide grains subjected to an internal chemical sensitization, such as described in U.S. Pat. Nos. 3,206,316, 3,317,322 and 3,367,778; a silver halide emulsion incorporated therein with polyvalent metal ions, such as described in U.S. Pat. Nos. 3,271,157 and 3,447,927; a silver halide emulsion comprising dopant-containing silver halide grains of which the surfaces are slightly chemical-sensitized, such as described in U.S. Pat. No. 3,761,276; a silver halide emulsion comprising grains having a multilayered structure, such as described in JP OPI Publication Nos. 50-8524/1975, 50-38525/1975 and 53-2408/1978; and silver halide emulsions such as described in JP OPI Publication Nos. 52-156614/1977 and 55-127549/1980.

The internal latent image forming type 2silver halide emulsions preferably applicable to the invention may be comprised of silver halides having any halide composition, such as silver bromide, silver chloride, silver chlorobromide, silver chloroiodide, silver iodobromide and silver chloroiodobromide. Among them, the grains containing silver chloride are excellent in developability and suitable for a rapid process.

The silver halide grains applicable to the invention may have any configurations such as a cube, an octahedron, a tetradecahedron comprising a mixture of (100) faces and (111) faces, a configuration having (110) faces, a sphere, and tabular-shaped grains. They may be preferably used when they have an average grain size within the range of 0.05 to 3 μm. They may be monodisperse type emulsions having a uniform grain size distribution and a uniform crystal habit or emulsions having an irregular grain sizes and crystal habits. Among them, it is preferable to use a monodisperse type silver halide emulsion having a uniform grain size and a uniform crystal habit. In the invention, the term, "a monodisperse type silver halide emulsion" means an emulsion in which not less than 80% and, preferably, not less than 70% by weight of the whole silver halide grain have a grain size within the range of ±20% of the average grain size r. In the formula, average grain size r is defined as grain size $r_i$ when a product $ni \times ri^3$ is maximized, wherein $r_i$ represents a grain size and $n_i$ represents a frequency of a grain having a grain size $r_i$. (in this case, the significant figures are 3 figures and the smallest figure is rounded by counting fraction of 5 and over as a unit and disregarding the rest. In the case of a spherical silver halide grain, the grain size thereof means a diameter of the grain and, in the case of a grain having the other configurations than the spherical configuration, the grain size thereof means a diameter obtained when the projective image of the grain is converted into a circular image having the same area. The grain sizes can be obtained, for example, by photographing a subject grain upon magnifying it 10,000 to 50,000 times larger through an electron microscope and then by practically measuring the grain size or the projected area produced on a print. (provided that, the numbers of the subject grains are not less than 1,000 at random).

Particularly preferable highly monodisperse type emulsions are those having not more than 20% of the distribution defined as follows.

(Standard grain deviation/Average grain size)×100=The range of a distribution (%)

wherein the average grain size and standard grain deviation are to be obtained from the above-defined $r_i$.

The above-mentioned monodisperse type emulsion can be prepared by adding a water-soluble silver salt solution and a water-soluble halide solution into a gelatin solution containing seed grains, in a double-jet process under the controls of the pAg and pH. For making the determination of the adding rate, JP OPI Publication Nos. 54-48521/1979 and 58-49938/1983 may be referred.

A further highly monodisperse type emulsion can be prepared in the process for growing en emulsion in the presence of a tetrazaindene compound, as disclosed in JP OPI Publication No. 60-122935/1985.

In the silver halide color photographic light sensitive materials of the invention, the yellow, magenta, cyan and black image-forming silver halide emulsion layers thereof may be in the spectral sensitivity wavelength regions different from each other. These spectral sensitivity wavelength regions may be either different from each other or any one of the regions from the visible regions to the infra-red regions, and any one of the regions can be selected.

In the invention, the yellow, magenta, cyan and black image-forming layers have each the different spectral sensitivities. In any one of the wavelengths in the spectral sensitivity wavelength regions of these layers, the wavelength is to have a sensitivity at least 4 times and, preferably, at least 8 times, higher than the sensitivities of the other layers.

In one of the preferable examples, the yellow, magenta, cyan and black image-forming layers are allowed to contain blue-sensitive, green-sensitive, red-sensitive and infra-red-sensitive silver halide emulsions in the spectrally sensitized regions of the silver halide emulsions, respectively.

In this case, it is allowed to use any colors of an image to be formed and any color-sensitivities of the silver halide emulsions in combination.

In the invention, the black image-forming layer is also allowed to have the spectral sensitivity regions having the portions common to those of the above-mentioned yellow, magenta and cyan image-forming silver halide emulsion layers, respectively.

In other words, the black image-forming layer of the invention has the sensitivities to the rays of light having any one each of the wavelengths in the spectral sensitivity wavelength regions of the yellow, magenta and cyan image-forming layers, respectively.

In one of the preferable embodiments of the invention, for example, the yellow, magenta, cyan and black image-forming layers contain the emulsions blue-sensitive, green-sensitive, red-sensitive, and sensitive to blue, green and red rays of light, respectively.

Such an emulsion as mentioned above can be materialized by selecting a spectrally sensitizing dye. For example, the above-mentioned emulsion sensitive to each of blue, green and red rays of light can be prepared, for example, by making combination use of a blue-sensitive emulsion and both of a green-sensitive and red-sensitive sensitizing dyes.

The yellow, magenta, cyan and black image-forming layers of the invention are multilayered on a support, respectively. They may, however, be arranged thereon in any order from the support.

In one of the preferable embodiments of the invention, for example, the cyan, magenta, yellow and black image-forming layers are arranged, respectively, in order from the closest position to the support. Besides these layers, an intermediate layer, a filter layer, a protective layer and so forth may also be arranged thereto, if required.

In the invention, based on a halftone dot information comprising the information of a yellow image, a magenta image, a cyan image and a black image, a color proof is preferable to be prepared by exposing a silver halide photographic light sensitive material to light so that the yellow, magenta, cyan and black image components may be formed, respectively.

As described above, a silver halide color photographic light sensitive material, comprised of the yellow, magenta, cyan and black image-forming silver halide emulsion layers, is exposed to light based on the halftone dot image information and, thereby a halftone dot image corresponding thereto can also be formed.

In one of the preferable embodiments of the invention, it is possible to obtain an image having yellow, magenta and cyan color image densities obtained in accordance with the halftone dot image information about a silver halide color photographic light sensitive material comprising the yellow, magenta and cyan image-forming silver halide emulsion layers, on which the yellow, magenta and cyan color image densities are overlaid in accordance with the black image information, respectively.

As one of the examples for illustration, the following description will be made of the case of a light sensitive material comprising a support bearing thereon a yellow image-forming green-sensitive negative type silver halide emulsion layers, a magenta image-forming green-sensitive negative type silver halide emulsion layer and a cyan image-forming red-sensitive negative type silver halide emulsion layer. An exposure is made to blue rays of light according to the yellow halftone dot information and then a certain medium density lower than the maximum density can be obtained by controlling the exposure quantity. In the same manner as above, a magenta image and a cyan image each having a certain medium densities can be obtained. Further, an exposure is made to the white rays of light according to a black image information in such an exposure quantity as is capable of obtaining each of the maximum densities of the yellow, magenta and cyan images. Thereby, the densities each of the yellow, magenta and cyan images, overlaid as the black image components, can be obtained. In the above-described manner, the yellow, magenta, cyan and black image components are each formed, so that a color proof can preferably be prepared.

Also in the case of making use of a positive type silver halide emulsion, the yellow, magenta and cyan image densities can be obtained as the black image component overlaid on the fixed yellow, magenta and cyan image components.

In the invention, silver halides may be optically sensitized by making use of a commonly applicable sensitizing dye. It is also useful for the silver halide emulsions of the invention to make combination use of the sensitizing dyes applicable to the super-color-sensitization of an internal latent image-forming type or negative type silver halide emulsion and the like emulsions. Those sensitizing dyes can be referred to Research Disclosure (hereinafter abbreviated to RD), Nos. 15162 and 17643.

In the invention, a black image-forming layer can be prepared in any conventional processes, provided that a black colored image can be formed after a development is completed. For example, it is allowed to utilize an image formed by making a silver image remained after completing a development process. It is also allowed to utilize a black coupler capable of forming a black image in a color development process. It is further allowed to obtain a black image upon mixing a yellow coupler, a magenta coupler and a cyan coupler together.

Among the silver halide photographic light sensitive materials of the invention, a silver halide color photographic light sensitive material is preferable, when it comprises the yellow, magenta and cyan image-forming layers having each of the monochromatic maximum densities thereof within the range of 1.50 to 1.90 obtained after completing a photographic process comprising a color developing step, and having the color component densities of the black color are each not lower than 1.90 obtained when the monochromatic maximum density are each overlaid with the maximum density of the black image-forming layer.

Among the silver halide photographic light sensitive materials of the invention, a silver halide color photographic light sensitive material is preferable, when it comprises the yellow, magenta and cyan image-forming layers having each of the monochromatic toe gradations of not lower than 1.7. Wherein the term, a toe gradation, is herein represented by the absolute value of the inclination of a line connected between a point indicating a density of 0.15 above the minimum density and another point indicating a density of 0.80 above the minimum density, on the characteristic curve thereof.

The methods for hardening a toe gradation include, for example, a method of narrowing the grain size distribution of silver halide emulsion grain. In the case of a color developer used in a color developing process, for example, the method can be achieved by increasing the amount of a color developing agent, by reducing the amount of a preservative such as hydroxyl amine or a sulfite, by replacing them by a weak reducing agent such as xylole and sorbit, by increasing the amount of a penetrant (such as benzyl alcohol), or by increasing the pH, temperature and developing time of a processing chemicals while adding an antifoggant or a toe portion cutting agent thereto.

In forming an internal latent image forming type direct positive image preferably applicable to the invention, an untifogging treatment can be carried out by making an overall exposure or by making use of a compound capable of producing fogging nuclei, that is, a foggant.

The above-mentioned overall exposure is carried out in the following manner. A light sensitive material imagewise exposed to light is dipped in a developer or other aqueous solution or is wetted and the whole surface thereof is then uniformly exposed to light. The light source to be used therein may be any kinds thereof, provided that it has the same rays of light as those in the light sensitive wavelength regions of the light sensitive material. The light sources may be those capable of emitting a high illumination intensity for a short time, such as a flash light, or may also be those capable of emitting a dim rays of light for a long time. The time for making an overall exposure may be widely varied in accordance with the use of such a light sensitive material as mentioned above, the conditions for development processes and the kind of the light sources used therein, so that the best positive image can finally be come out. The overall exposure is particularly preferable to be given in a prescribed exposure quantity, in the combination use with a subject light sensitive material. Usually, there is an tendency that the minimum density is raised or a desensitization is produced when giving an excessive quantity of exposure so that an image quality is degraded.

Next, the foggants preferably applicable to the invention will be detailed below.

As for the foggants applicable to the invention, the wide ranges of compounds may be used. The above-mentioned foggants may be made present in carrying out a development process. For example, it may be made present either in the other constitutional layers than the support of a light sensitive material (among which, silver halide emulsion layers are particularly preferable.), or in a developer or a processing solutions to be used in advance of a development process. The amount of the foggant to be used may be varied widely to meet the requirements. The amount added thereof is within the range of 1 to 1,500 mg and, preferably, 10 to 1,000 mg, each per mol of silver halide used therein when adding it to each silver halide emulsion layer, and within the range of 0.01 to 5 g/liter and, preferably, 0.05 to 1 g/liter when adding it to a processing solution such as a developer.

The foggants applicable to the invention include, for example; the hydrazines described in U.S. Pat. Nos. 2,563,785 and 2,588,982; the hydrazides or hydrazine compounds described in U.S. Pat. No. 3,227,552; the heterocyclic quaternary nitrogen salt compounds described in U.S. Pat. Nos. 3,615,615, 3,718,479, 3,719,494, 3,734,738 and 3,759,901; and the compounds each having an adsorption group adsorbable to the surfaces of a silver halide, such as acylhydrazinophenylthio ureas, described in U.S. Pat. No. 4,030,925. These foggants may also be used in combination. In the foregoing RD, for example, the combination use of a non-adsorption group and an adsorption group is described. The techniques for making combination use of these groups are also effective in the invention. As for the foggants applicable to the invention, those of the adsorption type and the non-adsorption type may be used either and they may also be used in combination.

The typical examples of the useful foggants include hydrazine compounds such as a hydrazine hydrochloride, 4-methylphenyl hydrazine hydrochloride, 1-acetyl-2-phenylhydrazine, 1-formyl-2-(4-methylphenyl) hydrazine, 1-methylsulfonyl-2-phenyl hydrazine, 1-methylsulfonyl-2-(3-phenylsulfonamidophenyl) hydrazine, 1-benzoyl-2-phenyl hydrazine, formaldehyde phenyl hydrazine; N-substituted quaternary cycloammonium salts such as 3-(2-formylethyl)-2-methylbenzothiazolium bromide, 3-(2-acetylethyl)-2-benzyl-5-phenylbenzoxazolium bromide, 3- (2-acetylethyl) -2-benzylbenzoselenazolium bromide, 2-methyl-3-[3-(phenylhydrazino)propyl] benzothiazolium bromide, 1,2-dihydro-3-methyl-4-phenyl pyrrolido[2,1-b] benzothiazolium bromide, 1,2-dihydro-3-methyl-4-phenyl pyrrolido[2,1-b] benzoselenazolium bromide and 4,4'-ethylene bis (1,2-dihydro-3-methyl pyrrolido 8 2,1-b] benzothiazolium bromide; and 5-(3-ethyl-2-benzothiazolinidene)-3-[4-(2-formylhydrazino)phenyl] rhodanine, 1,3-bis[4-(2-formylhydrazino)phenyl]thiourea, 7-(3-ethoxythiocarbonylamino benzamido)-9-methyl-10-propargyl-1,2,3,4-tetrahydroacridinium trifluoromethane sulfonate, and 1-formyl-2-[4-{3-(2-methoxyphenyl) ureido}phenyl] hydrazine.

With the photographic light sensitive material having each the silver halide emulsion layer relating to the invention, a direct positive image can be formed by making an imagewise exposure and then by making an overall exposure or by carrying out a development process in the presence of a foggant.

In the developers for developing the photographic light sensitive materials relating to the invention, the developing agents thereof include common silver halide developing agents including, for example, polyhydroxybenzenes such as hydroquinone, aminophenols, 3-pyrazolidones, ascorbic acid and the derivatives thereof, reductons, phenylenediamines, and the mixtures thereof. The typical examples thereof include hydroquinone, aminophenol, N-methylaminophenol, 1-phenyl-3-pyrazolidone, 1-phenyl-4,4-dimethyl-3-pyrazolidone, 1-phenyl-4-methyl-4-hydroxymethyl-3-pyrazolidone, ascorbic acid, N,N-diethyl-p-phenylenediamine, diethylamino-o-toluidine, 4-amino-3-methyl-N-ethyl-N-(β-methanesulfonamidoethyl) aniline, 4-amino-3-methyl-N-ethyl-N-(β-hydroxyethyl) aniline, and 4-amino-N-ethyl-N-(β-hydroxyethyl) aniline. It is also allowed to contain these developing agents in an emulsion in advance so that they can react with silver halide while dipping them in an aqueous high pH solution.

The developers applicable to the invention can further contain a specific antifoggant and a development inhibitor, or these developer additives can also freely be incorporated into the component layers of a photographic light sensitive material.

Into the silver halide photographic light sensitive materials of the invention, any well-known photographic additives may be used.

The above-mentioned well-known photographic additives include, for example, the compounds described in RD 17643 and RD 18716 as shown in the following table.

| | RD 17643 | | RD 18716 | |
|---|---|---|---|---|
| Additive | Page | Class | Page | Class |
| Chemical sensitizer | 23 | III | 648 | Upper (R) |
| Sensitizing dye | 23 | IV | 648 | Upper (R) |
| Development accelerator | 29 | XXI | 648 | Upper (R) |
| Antifoggant | 24 | VI | 649 | Lower (R) |
| Stabilizer | " | " | | " |
| Color-stain preventive | 25 | VII | 650 | (L)~(R) |
| Image stabilizer | 25 | VII | | |
| UV absorbent | 25~26 | VII | 649(R) | ~650(L) |
| Filter dye | " | " | | " |
| Whitening agent | 24 | V | | |
| Hardener | 26 | X | 651(R) | |
| Coating aid | 26~27 | XI | 650(R) | |
| Surfactant | 26~27 | XI | 650(R) | |
| Plasticizer | 27 | XII | 650(R) | |
| Lubricant | " | " | | " |
| Antistatic agent | " | " | | " |
| Matting agent | 28 | XVI | 650(R) | |
| Binder | 29 | IX | 651(R) | |

To the emulsion layers of the light sensitive materials relating to the invention, the dye-forming couplers capable of producing the corresponding dyes upon making coupling reaction with the oxidized products of a color developing agent. It is usual that the above-mentioned dye-forming couplers are so selected as to produce the dyes capable of absorbing the photosensitive spectral rays of light of the emulsion layers, respectively. Accordingly, a yellow dye-forming coupler is used in a blue-sensitive emulsion layer, a magenta dye-forming coupler is used in a green-sensitive emulsion layer and a cyan dye-forming coupler is used in a red-sensitive emulsion layer, respectively. It is, however, allowed that a silver halide color photographic light sensitive material may be prepared in the different way from the above-mentioned couplers-layers combination so as to meet the purposes of application.

It is advisable that each of these dye-forming couplers is to have a group, so-called a ballast group, that contains not less than 8 carbon atoms in the molecules thereof and is capable of non-diffusing the coupler. These dye-forming couplers may be either of the 4-equivalent type in which 4 molecules of silver ions are required to be reduced for producing one molecule of the dye, or of the 2-equivalent type in which only 2 molecules of silver ions are required to be reduced for producing one molecule of the dye. It is also allowed to use a DIR coupler capable of releasing a development inhibitor while being developed and improving the sharpness and graininess of an image, and a DIR coupler capable of producing a colorless compound upon making a coupling reaction with the oxidized products of a developing agent and, at the same time, capable of releasing a development inhibitor.

The DIR couplers and DIR compounds each applicable thereto include, for example, those having an inhibitor directly coupled to the coupling position thereof, and those having an inhibitor coupled to the coupling position thereof through a divalent group so that the inhibitor may be released therefrom either by an intramolecular nucleophilic reaction produced in a group split off by a coupling reaction, or by an intramolecular electron-transfer reaction, (these couplers and compounds are hereinafter referred to as timing DIR couplers and timing DIR compounds, respectively).

It is allowed to make combination use a dye-forming coupler and a colorless coupler capable of making a coupling reaction with the oxidized products of an aromatic primary amine type developing agent, but incapable of producing any dye. (hereinafter referred to as a competing coupler).

The yellow dye-forming couplers preferably applicable thereto include, for example, any well-known acylacetanilide type couplers. Among them, the benzoylacetanilide type and pivaloylacetanilide type compounds are advantageously used.

The magenta couplers applicable thereto include, for example, those of the well-known 5-pyrazolone type, pyrazolobenzimidazole type, pyrazoloazole type, acylacetonitrile type and indazolone type.

The cyan dye-forming couplers applicable thereto include, for example, those of the well-known phenol type, naphthol type and imidazole type.

They include, typically, phenol type couplers each substituted thereto an alkyl, acylamino, ureido group or the like, naphthol type couplers produced of a 5-aminonaphthol skeleton, and 2-equivalent naphthol type couplers each introduced therein an oxygen atom as the split-off group.

It is preferable to make combination use of a magenta coupler and a yellow coupler in the magenta image-forming layer of the color photographic light sensitive materials of the invention so that the color of the image can be made closer to the tone of a printing ink.

An oil-soluble dye preferably applicable to the invention herein means an organic dye having a solubility to water at 20° C. of not higher than $1\times10^{-2}$ (in terms of [g/100 g of water] (an amount by weight of a subject material dissolvable in 100 g of water). The typical compounds thereof include, for example, an anthraquinone type compound and an azo type compound.

It is preferable that the oil-soluble dyes relating to the invention have each the molecular photoabsorptivity coefficient of the maximum absorption wavelength is not less than 5000 and, preferably, not less than 20000, in the wavelength region exceeding 400 nm, (in the case of using a chloroform solvent).

The oil-soluble dyes preferably applicable to the light sensitive materials of the invention may be coated in an amount within the range of 0.01 mg/m$^2$ to 10 mg/m$^2$ and, preferably, 0.05 mg/m$^2$ to 5 mg/m$^2$.

The oil-soluble dyes applicable to the invention may be used in any photographic emulsion layers. It is, however, preferable to add them to non-light sensitive layers other than coupler-containing layers.

The oil-soluble dyes relating to the invention may preferably be used in the method that, when an oil-soluble dye has not less than 20000 of the molecular photoabsorptivity of the maximum absorption wavelength in the wavelength region exceeding 400 nm, the dye is added, in an amount coated within the range of 0.05 mg/m$^2$ to 5 mg/m$^2$, into non-light sensitive layers other than coupler-containing layers.

The oil-soluble dyes preferably applicable to the invention include, for example, the compounds having the following Formula (4) or (5).

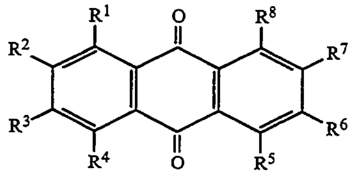

Formula (4)

wherein $R^1$ through $R^8$ represent each a hydrogen atom, a hydroxy group, an amino group or a halogen atom.

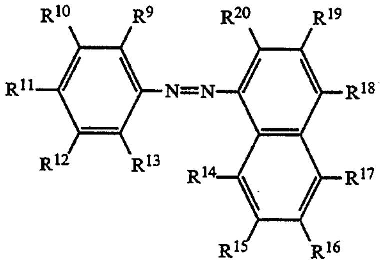

Formula (5)

wherein $R^9$ through $R^{20}$ represent each a hydrogen atom, a halogen atom, a nitro atom, a hydroxy atom, an alkyl group, an alkoxy group, an aminocarbonyl group, an amino group or an N═N-R group, (in which R represents an aryl group).

The halogen atoms represented by $R^1$ through $R^8$ denoted in Formula (4) include, for example, chlorine atom and bromine atom. Or, the amino groups represented by $R^1$ through $R^8$ may be those having substituents. The substituents include, for example, alkyl groups (such as methyl and butyl groups), aryl groups (such as phenyl group), acyl groups (such as methoxy and benzoyl groups), and so forth.

The halogen atoms represented by $R^9$ through $R^{20}$ denoted in Formula (5) include, for example, chlorine atom and bromine atom. The alkyl groups include, for example, methyl, ethyl and propyl groups. The alkoxy groups include, for example, methoxy, ethoxy and propoxy groups. The aminocarbonyl groups include, for example, methyl aminocarbonyl and phenyl aminocarbonyl groups. The amino groups represented by $R^9$ through $R^{20}$ may also have the same substituents as in the case of Formula (4).

The typical examples of the oil-soluble dyes applicable to the invention will be given below. However, the invention shall not be limited thereto.

Formula (4)

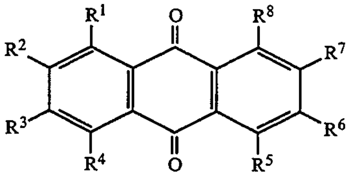

| Compound No. | $R^1$ | $R^2$ | $R^3$ | $R^4$ | $R^5$ | $R^6$ | $R^7$ | $R^8$ |
|---|---|---|---|---|---|---|---|---|
| 1 | H | H | H | H | H | H | H | $-NHCH_3$ |
| 2 | H | H | H | H | —OH | H | H | 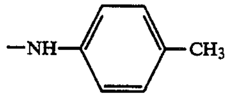 |
| 3 | H | H | H | H | $-NH_2$ | H | H | $-NH_2$ |
| 4 | H | H | H | H | $-NH_2$ | H | —Br | —OH |
| 5 | H | H | H | H | 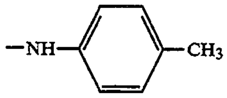 | H | H | $-NHCH_3$ |
| 6 | H | H | H | H | 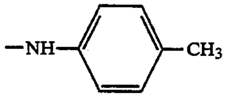 | H | H | $-NH_2$ |
| 7 | H | H | H | H | 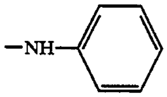 | H | H | 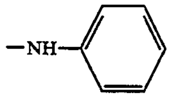 |
| 8 | H | H | H | H | 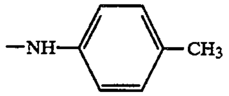 | H | H | 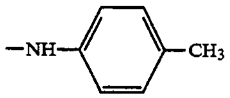 |
| 9 | H | H | H | H | $-NHC_4H_9(n)$ | H | H | $-NHC_4H_9(n)$ |
| 19 | H | H | H | H | H | H | H | 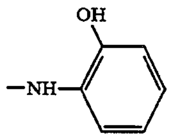 |
| 21 | H | H | H | 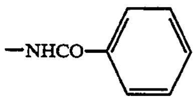 | H | H | H | 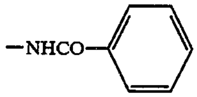 |

Formula (5)

-continued
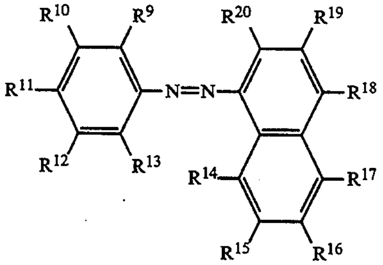
;
| Compound No. | $R^9$ | $R^{10}$ | $R^{11}$ | $R^{12}$ | $R^{13}$ | $R^{14}$ | $R^{15}$ | $R^{16}$ | $R^{17}$ | $R^{18}$ | $R^{19}$ | $R^{20}$ |
|---|---|---|---|---|---|---|---|---|---|---|---|---|
| 10 | $-CH_3$ | H | H | H | H | H | H | H | H | H | H | $-OH$ |
| 11 | H | H | 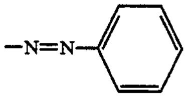 | H | H | H | H | H | H | $-NH_2$ | H | H |
| 12 | $-OCH_3$ | H | H | H | H | H | H | H | H | H | H | $-OH$ |
| 13 | H | H | 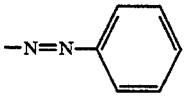 | H | H | H | H | H | H | H | H | $-OH$ |
| 14 | H | H | $-OC_2H_5$ | H | H | H | H | H | H | $-OH$ | H | H |
| 15 | $-CH_3$ | H | 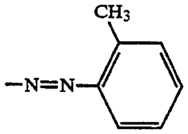 | H | H | H | H | H | H | H | H | $-OH$ |
| 22 | $-NO_2$ | H | $-NO_2$ | H | H | H | H | H | H | H | H | $-OH$ |
| 23 | H | $-Cl$ | $-NO_2$ | H | H | H | H | H | H | H | 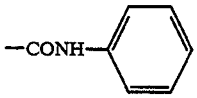 | $-OH$ |
| 25 | $-CH_3$ | H | H | $-NO_2$ | H | H | H | H | H | H | 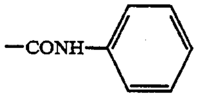 | $-OH$ |
16
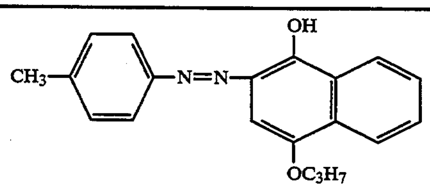
17
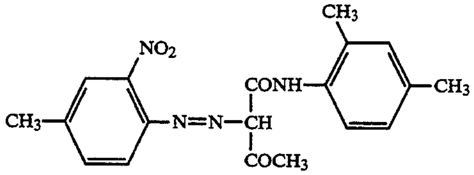
18
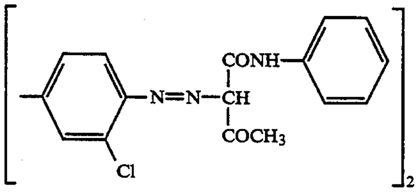

-continued

20

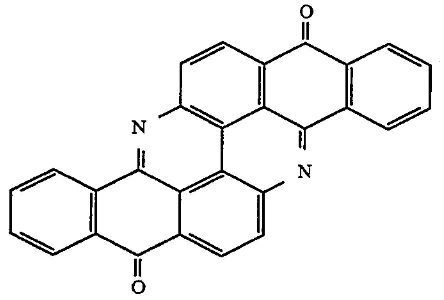

24

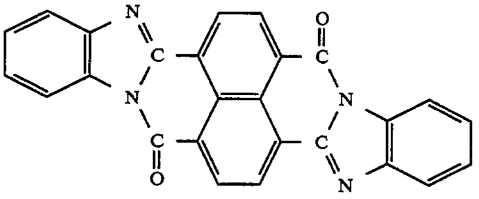

26

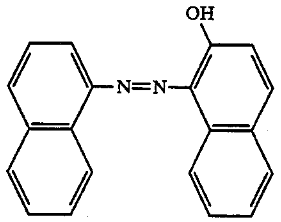

27

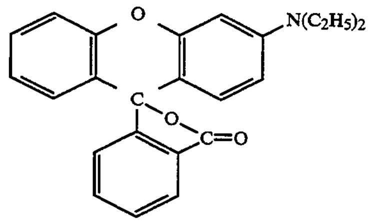

It is preferable to contain a fluorescent whitening agent in the light sensitive materials of the invention and/or the processing solutions for processing the light sensitive materials thereof.

The fluorescent whitening agents preferably applicable thereto include, for example, those of the stilbene type, triazine type, imidazolone type, pyrazoline type, triazole type, coumarin type, acetylene type, oxazole type and oxadiazole type. These fluorescent whitening agents are described in, for example, U.S. Pat. Nos. 2,571,706, 2,581,057, 2,618,636, 2,701,296, 2,713,054, 2,715,630, 2,723,197, 3,269,840, 3,513,102, 3,615,544, 3,615,547, 3,684,729, 3,788,854 and 3,789,012; British Patent No. 669,590; Dutch Patent No. 74,109; German Patent No. 911,368; German Patent (OLS) No. 2,525,680; and JP OPI Publication No. 34-7127/1959. These compounds may be of the water-soluble, or the insoluble compounds may also be used in the form of a dispersion.

The supports applicable to the light sensitive materials of the invention include, for example, those given in the foregoing RD 17643, p.28 and RD 18716, p.647. The suitable supports therefor include, for example, those made of polymer films or paper. These supports may also be treated for enhancing the adhesive property and antistatic property.

EXAMPLES

Now, the invention will be detailed with reference to the following examples. It is, however, to be understood that the invention shall not be limited thereto.

Example 1

A multilayered color photographic light sensitive material was prepared in the following manner. On a 100 μm-thick paper-made support, that was laminated with polyethylene on one surface thereof and laminated with polyethylene containing titanium oxide on the layer 1 side of the other surface thereof. Then, the layers having the following compositions were each coated on the resulting paper-made support.

(Preparation of Emulsion EM-1)

An aqueous solution containing ammonia and silver nitrate and an aqueous solution containing potassium bromide and sodium chloride (in a mol ratio of KBr:NaCl=95:5) were each added at the same time into an aqueous solution containing ossein gelatin, while keeping a temperature of 40° C. in a controlled double-jet method, so that a cubic silver chlorobromide core emulsion having a grain size of 0.30 μm could be prepared. In this preparation, the pH and pAg were each so controlled as to obtain the cubes as the grain configuration of the resulting emulsion. Further, an aqueous solution containing ammonia and silver nitrate and an aqueous solution containing potassium bromide and sodium chloride (in a mol ratio of KBr:NaCl=40:60) were each added at the same time into the resulting core emulsion, so that the shells could be produced until the average grains size thereof could be 0.42 μm. In this shell production, the pH and pAg were each so controlled as to obtain the cubes as the grain configuration.

Emulsion EM-1 was prepared by carrying out a washing treatment for removing the water-soluble salts and then by adding gelatin. The resulting emulsion EM-1 was proved to have a distribution range of 8%.

(Preparation of Emulsion EM-2)

While controlling an aqueous solution containing ossein gelatin to be kept at 40° C., an aqueous solution containing ammonia and silver nitrate and an aqueous solution containing potassium bromide and sodium chloride (in a mol ratio of KBr:NaCl=95:5) were added together at the same time in a controlled double-jet process, so that a cubic silver chlorobromide core emulsion having a grain size of 0.18 μm could be prepared. In the preparation, the pH and pAg thereof were controlled so that the grain configuration could be in the cubic-shaped. Further, an aqueous solution containing ammonia and silver nitrate and an aqueous solution containing potassium bromide and sodium chloride (in a mol ratio of KBr:NaCl=40:60) were added at the same time into the resulting core emulsion in a controlled double-jet process, so that the shells could be prepared to have an average grain size of 0.25 μm. In this preparation, the pH and pAg thereof were controlled so that the grain configuration could be in the cubic-shaped.

After a washing treatment was carried out, the water-soluble salts were removed and gelatin was then added, so that emulsion EM-2 could be prepared. The distribution range of the resulting emulsion EM-2 was 8%.

(Preparation of Blue-Sensitive Emulsion EM-B)

Blue-sensitive emulsion EM-B was prepared by adding sensitizing dye D-1 into EM-1, then by carrying out a color sensitization and further by adding T-1 in an amount of 600 mg per mol of silver.

(Preparation of Green-Sensitive Emulsion EM-G)

Green-sensitive emulsion EM-G was prepared in the same manner as in the above-mentioned blue-sensitive emulsion, except that sensitizing dye D-2 was added into EM-2 and a color sensitization was then carried out.

(Preparation of Red-Sensitive Emulsion EM-R)

Red-sensitive emulsion EM-R was prepared in the same manner as in the above-mentioned blue-sensitive emulsion, except that sensitizing dyes D-3 and D-4 were added into EM-2 and a color sensitization was then carried out.

(Preparation of Panchromatic-Sensitive Emulsion EM-P)

Panchromatic-sensitive emulsion EM-P was prepared in the same manner as in the above-mentioned blue-sensitive emulsion, except that sensitizing dyes D-1, D-2, D-3 and D-4 were added into EM-1 and a color sensitization was then carried out.

T-1 represents 4-hydroxy-6-methyl-1,3,3a,7-tetrazaindene

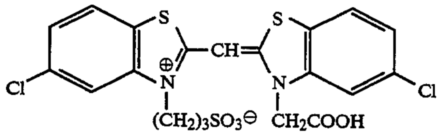

D-1

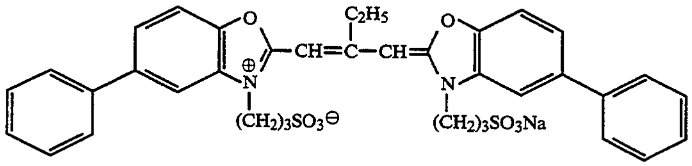

D-2

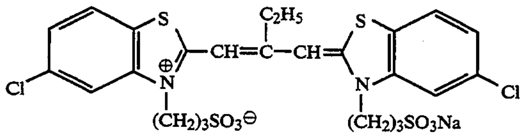

D-3

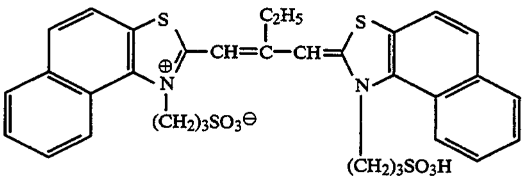

D-4

-continued

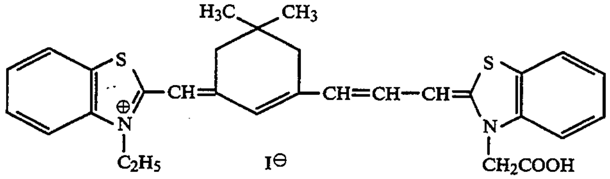

D-5

By making use of the above-mentioned EM-B, EM-G and EM-R, color photographic light sensitive material 1-1 having the following compositions was prepared. On the surface of the above-mentioned support, Layers 1 through 8 were each coated so as to have the following compositions. In the sample 1-1, coating aids SA-1 and SA-2, and layer hardeners H-1 and H-2 were each also used.

SA-1: Sodium sulfosuccinic acid di(2-ethylhexyl) ester

SA-2: Sodium sulfosuccinic acid di(2,2,3,3,4,4,5,5-octafluoropentyl) ester

H-1: Sodium 2,4-dichloro-6-hydroxy-s-triazine

H-2: Tetrakis (vinyl sulfonyl methyl) methane

| Layer | Constitution | Amount coated (g/m²) |
|---|---|---|
| Layer 8 (UV absorbing layer) | Gelatin | 0.78 |
| | UV absorbent (UV-1) | 0.065 |
| | UV absorbent (UV-2) | 0.120 |
| | UV absorbent (UV-3) | 0.160 |
| | Solvent (SO-2) | 0.1 |
| | Silica matting agent | 0.03 |
| Layer 7 (Blue-sensitive layer) | Gelatin | 1.43 |
| | Blue-sensitive emulsion EM-B (in silver coverage) | 0.5 |
| | Yellow coupler (YC-A) | 0.82 |
| | Antistaining agent (AS-2) | 0.025 |
| | Solvent (SO-1) | 0.82 |
| | Inhibitors (ST-1, ST-2, T-1) | |
| Layer 6 (Intermediate layer) | Gelatin | 0.54 |
| | Color mixture preventive (AS-1) | 0.055 |
| | Solvent (SO-2) | 0.072 |
| Layer 5 (Yellow colloidal silver layer) | Gelatin | 0.42 |
| | Yellow colloidal silver | 0.1 |
| | Color mixture preventive (AS-1) | 0.04 |
| | Solvent (SO-2) | 0.049 |
| | Polyvinyl pyrrolidone (PVP) | 0.047 |
| Layer 4 (Intermediate layer) | Gelatin | 0.54 |
| | Color mixture preventive (AS-1) | 0.055 |
| | Solvent (SO-2) | 0.072 |
| Layer 3 (Green-sensitive layer) | Gelatin | 1.43 |
| | Green-sensitive emulsion EM-G (in silver coverage) | 0.50 |
| | Magenta coupler (MC-1) | 0.25 |
| | Yellow coupler (YC-C) | 0.06 |
| | Antistaining agent (AS-2) | 0.019 |
| | Solvent (SO-1) | 0.31 |
| | Inhibitors (ST-1, ST-2, T-1) | |
| Layer 2 (Intermediate layer) | Gelatin | 0.75 |
| | Color mixture preventive (AS-1) | 0.055 |
| | Solvent (SO-2) | 0.072 |
| Layer 1 (Red-sensitive layer) | Gelatin | 1.38 |
| | Red-sensitive emulsion EM-R (in silver coverage) | 0.30 |
| | Cyan coupler (CC-2) | 0.44 |
| | Solvent (SO-1) | 0.31 |
| | Antistaining agent (AS-2) | 0.015 |
| | Inhibitors (ST-1, ST-2, T-1) | |

The silver coverages were expressed in terms of silver contents.

Sample 1-2 was prepared in the same manner as in the above-mentioned sample 1-1, except that layers S-1 and S-2 each having the following compositions were each interposed between the support and Layer 1.

| | | |
|---|---|---|
| Layer S-2 | (Intermediate layer) | |
| | Gelatin | 0.5 |
| Layer S-1 | (White pigment layer) | |
| | Gelatin | 1.5 |
| | Anatase type titanium dioxide, (W-10, manufactured by Ishihara Industrial Co., Ltd.) | 3.0 |

Samples 1-3 and 1-4 were each prepared in the same manner, except that yellow couplers YC-A of layers 7 of samples 1-1 and 1-2 were replaced by yellow couplers Y-1-3, respectively.

Samples 1-5 through 1-9 were each prepared in the same manner as in the above-mentioned Sample 1-4, except that yellow coupler YC-A of layer 7 of sample 1-4 was replaced by those shown in the following Table 1, respectively.

Color photographic light sensitive material 1-10 was prepared, in the same manner as in the above-mentioned Sample 1-1, so as to have the following constitution by applying the above-mentioned EM-B, EM-G and EM-R onto the above-mentioned support.

| Layer | Constitution | Amount coated (g/m²) |
|---|---|---|
| Layer 12 (UV absorbing layer) | Gelatin | 0.78 |
| | UV absorbent (UV-I) | 0.065 |
| | UV absorbent (UV-2) | 0.120 |
| | UV absorbent (UV-3) | 0.160 |
| | Solvent (SO-2) | 0.1 |
| | Silica matting agent | 0.03 |
| Layer 11 (Panchromatic sensitive layer) | Gelatin | 1.05 |
| | Panchromatic sensitive emulsion EM-P (in silver coverage) | 0.30 |
| | Yellow coupler (YC-A) | 0.21 |
| | Magenta coupler (MC-1) | 0.063 |
| | Cyan coupler (CC-1) | 0.110 |
| | Antistaining agent (AS-2) | 0.019 |
| | Solvent (SO-1) | 0.615 |
| Layer 10 (Intermediate layer) | Gelatin | 0.75 |
| | Color mixture preventive (AS-1) | 0.055 |
| | Solvent (SO-2) | 0.072 |
| Layer 9 (Blue-sensitive layer) | Gelatin | 1.14 |
| | Blue-sensitive emulsion EM-B (in silver coverage) | 0.4 |

-continued

| Layer | Constitution | Amount coated ($g/m^2$) |
|---|---|---|
| | Yellow coupler (YC-A) | 0.656 |
| | Antistaining agent (AS-2) | 0.02 |
| | Solvent (SO-1) | 0.656 |
| | Inhibitors (ST-1, ST-2, T-1) | |
| Layer 8 (Intermediate layer) | Gelatin | 0.54 |
| | Color mixture preventive (AS-1) | 0.055 |
| | Solvent (SO-2) | 0.072 |
| Layer 7 (Yellow colloidal silver layer) | Gelatin | 0.42 |
| | Yellow colloidal silver | 0.1 |
| | Color mixture preventive (AS-1) | 0.04 |
| | Solvent (SO-2) | 0.049 |
| | Polyvinyl pyrrolidone (PVP) | 0.047 |
| Layer 6 (Intermediate layer) | Gelatin | 0.54 |
| | Color mixture preventive (AS-1) | 0.055 |
| | Solvent (SO-2) | 0.072 |
| Layer 5 (Green-sensitive layer) | Gelatin | 1.14 |
| | Green-sensitive emulsion EM-G (in silver coverage) | 0.40 |
| | Magenta coupler (MC-1) | 0.20 |
| | Yellow coupler (YC-C) | 0.05 |
| | Antistaining agent (AS-2) | 0.0152 |
| | Solvent (SO-1) | 0.248 |
| | Inhibitors (ST-1, ST-2, T-1) | |
| Layer 4 (Intermediate layer) | Gelatin | 0.75 |
| | Color mixture preventive (AS-1) | 0.055 |
| | Solvent (SO-2) | 0.072 |
| Layer 3 ((Red-sensitive layer) | Gelatin | 1.10 |
| | Red-sensitive emulsion EM-R (in silver coverage) | 0.24 |
| | Cyan coupler (CC-2) | 0.352 |
| | Solvent (SO-1) | 0.248 |
| | Antistaining agent (AS-2) | 0.012 |
| | Inhibitors (ST-1, ST-2, T-1) | |
| Layer 2 (Intermediate layer) | Gelatin | 0.5 |
| Layer 1 (White pigment layer) | Gelatin | 1.5 |
| | Anatase type titanium dioxide, (W-10, manufactured by Ishihara Industrial Co., Ltd.). | 3.0 |

Sample 1-11 was prepared in the same manner as in the above-mentioned Sample 1-10, except that yellow coupler YC-A of Layer 9 of Sample 1-10 was replaced by Y-1-58.

SO-1: Trioctyl phosphate
SO-2: Dioctyl phthalate
AS-1: 2,4-di-t-octyl hydroquinone
AS-2: 2,4-di-t-butyl hydroquinone
ST-1: 1-(3-acetamidophenyl)-5-mercaptotetrazole
ST-2: N-benzyladenine

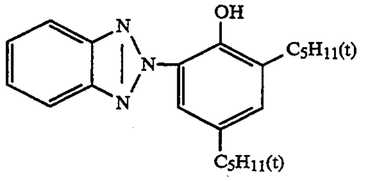
UV-1

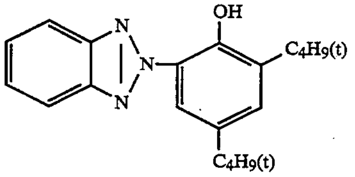
UV-2

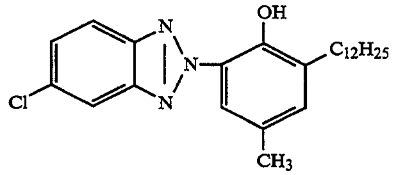
UV-3

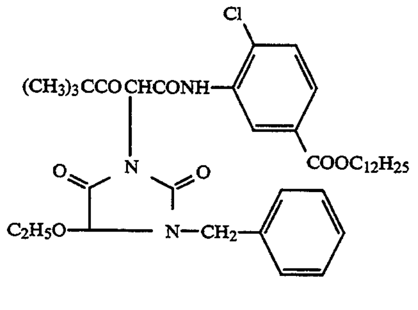
YC-A

-continued

YC-B

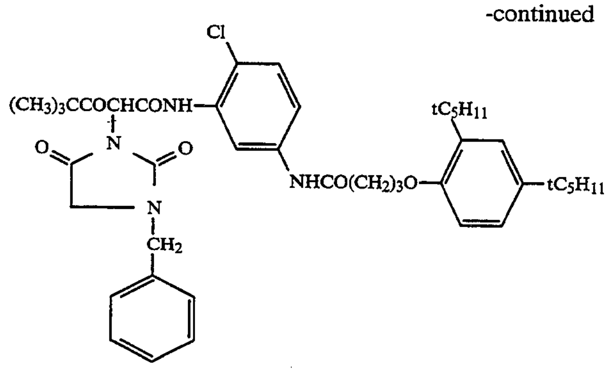

YC-C

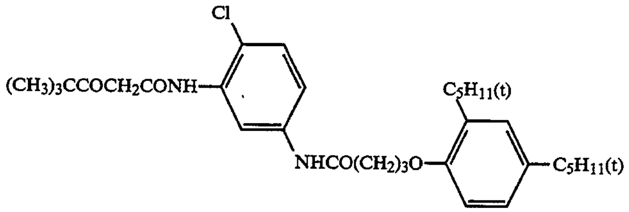

MC-1

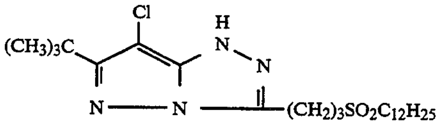

CC-1

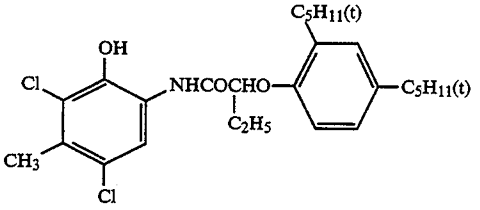

TABLE 1

| Sample No. | White pigment layer | Yellow coupler | Black image layer |
|---|---|---|---|
| 1-1 (Comparison) | Not arranged | YC-A | Not arranged |
| 1-2 (Comparison) | Arranged | YC-A | Not arranged |
| 1-3 (Comparison) | Not arranged | Y-1-3 | Not arranged |
| 1-4 (Invention) | Arranged | Y-1-3 | Not arranged |
| 1-5 (Invention) | Arranged | Y-1-52 | Not arranged |
| 1-6 (Invention) | Arranged | Y-1-53 | Not arranged |
| 1-7 (Invention) | Arranged | Y-1-26 | Not arranged |
| 1-8 (Comparison) | Arranged | YC-B | Not arranged |
| 1-9 (Invention) | Arranged | Y-1-58 | Not arranged |
| 1-10 (Invention) | Arranged | YC-A | Arranged |
| 1-11 (Invention) | Arranged | Y-1-58 | Arranged |

The resulting Samples 1-1 through 1-11 were each brought into close contact with the black and cyan printers out of the halftone dot original document, and they were exposed to light under the following exposure conditions-1. Next, the samples were each brought into close contact with the black and magenta printers, and they were exposed to light under the following exposure conditions-2. Further, the samples were each brought into close contact with the black and yellow printers, and they were exposed to light under the following exposure conditions-3.

Each of the exposed light sensitive materials was processed in the following development process, so that the dye images each made of the halftone dots could be obtained.

The results of the density measurements obtained will be shown in the table given later. The density measurements were carried out by making use of a densitometer, Model PD-65 manufactured by Konica Corp.

(Exposure conditions-1)

When each of the light sensitive material was exposed to white light through a red filter (Wratten No. 26) and an ND filter, the density of the ND filter was adjusted so that the exposure could be made for 0.5 seconds in the lowest possible exposure quantity for minimizing the red light density to be obtained after completing the development process.

(Exposure conditions-2)

When each of the light sensitive material was exposed to white light through a green filter (Wratten No. 58) and an ND filter, the density of the ND filter was adjusted so that the exposure could be made for 0.5 seconds in the lowest possible exposure quantity for minimizing the green light density to be obtained after completing the development process.

(Exposure conditions-3)

When each of the light sensitive material was exposed to white light through a blue filter (Wratten No. 47B) and an ND filter, the density of the ND filter was adjusted so that the exposure could be made for 0.5 seconds in the lowest possible exposure quantity for minimizing the blue light density to be obtained after completing the development process.

In this case, a daylight type fluorescent lamp was used as the light source for the above-mentioned exposure conditions-1 through -3.

The processing was carried out in accordance with the following processing steps-1, (by making use of a fresh solutions), provided that the fogging exposure was made uniformly over to the whole surface of each of the subject light sensitive materials, through the 3 mm-thick developer layer, as the light sensitive materials were being dipped in the developer.

The other parts of the light sensitive materials were exposed to light under quite the same conditions as in the case of using the fresh solutions and they were then processed in the same manner as in the processing steps-1. On the other hand, however, the developer used in processing steps-1 was replenished by a replenisher until the total amount of the replenisher could be 3 times as much as the capacity of the developing tank. The aforementioned Sample 1-4 was running-processed with the replenished developer, a bleach-fixer and a stabilizer. Then, the exposed samples were processed with the resulting developer, bleach-fixer and stabilizer each already used in the running-process, (by making use of the solutions for the running-process).

In the resulting image obtained in the processing treatments carried out with the fresh solutions and when the density of the image area could be 0.3 in terms of the density measured through the green light, the difference was checked up between the resulting image density and the image density obtained from the same image area obtained in the running-process. The results of the difference will be shown later.

Of the fine lines of the black letter portions of the resulting images, each of the black background solidness was visually evaluated in terms of the three grades, wherein O represents an excellent black solidness, X represents a poor solidness, and Δ represents a medium solidness.

| Processing steps-1 | Temperature | Time |
|---|---|---|
| Dipping (in a developer) | 37° C. | 12 sec. |
| Fogging exposure (at 1 lux) | — | 12 sec. |
| Developing | 37° C. | 95 sec. |
| Bleach-fixing | 35° C. | 45 sec. |
| Stabilizing | 25~30° C. | 90 sec. |
| Drying | 60~85° C. | 40 sec. |

Composition of Developer

| (Color developer) | |
|---|---|
| Benzyl alcohol | 15.0 ml |
| Ceric sulfate | 0.015 g |
| Ethylene glycol | 8.0 ml |
| Potassium sulfite | 2.5 g |
| Potassium bromide | 0.6 g |
| Sodium chloride | 0.2 g |
| Potassium carbonate | 25.0 g |
| T-1 | 0.1 g |
| Hydroxylamine sulfate | 5.0 g |
| Sodium diethylenetriamine pentaacetate | 2.0 g |
| 4-amino-N-ethyl-N-(β-methanesulfonamidoethyl) metatoluidine.3/2 sulfate, monohydrate | 4.5 g |
| Fluorescent whitening agent, (a 4,4'-diaminostilbene disulfonic acid derivative) | 1.0 g |
| Potassium hydroxide | 2.0 g |
| Diethylene glycol | 15.0 ml |
| Add water to make | 1 liter |
| Adjust pH to be | pH 10.15 |
| (Bleach-fixer) | |
| Ferric ammonium diethylenetriamine pentaacetate | 90.0 g |
| Diethylenetriamine pentaacetic acid | 3.0 g |

-continued

| | |
|---|---|
| Ammnonium thiosulfate, (in an aqueous 70% solution) | 180 ml |
| Ammonium sulfite, (in an aqueous 40% solution) | 27.5 ml |
| 3-mercapto-1,2,4-triazole | 0.15 g |
| Adjust pH with potassium carbonate or glacial acetic acid to be | pH 7.1 |
| Add water to make the total of | 1 liter |
| (Stabilizer) | |
| o-phenylphenol | 0.3 g |
| Potassium sulfite, (in an aqueous 50% solution) | 12 ml |
| Ethylene glycol | 10 g |
| 1-hydroxyethylidene-1,1-diphosphonic acid | 2.5 g |
| Bismuth chloride | 0.2 g |
| Zinc sulfate, heptahydrate | 0.7 g |
| Ammonium hydroxide, (in an aqueous 28% solution) | 2.0 g |
| Polyvinyl pyrrolidone (K-17) | 0.2 g |
| Fluorescent whitening agent, (a 4,4'-diaminostilbene disulfonic acid derivative) | 2.0 g |
| Add water to make the total of | 1 liter |
| Adjust pH with ammonium hydroxide or sulfuric acid to be | pH 7.5 |

The stabilizing treatment was carried out in a double-tank type counter-current processing system.

The following formulas are for the replenishers applied to the running processing treatments.

| (Color developer replenisher) | |
|---|---|
| Benzyl alcohol | 18.5 ml |
| Ceric sulfate | 0.015 g |
| Ethylene glycol | 10.0 ml |
| Potassium sulfite | 2.5 g |
| Potassium bromide | 0.3 g |
| Sodium chloride | 0.2 g |
| Potassium carbonate | 25.0 g |
| T-1 | 0.1 g |
| Hydroxylamine sulfate | 5.0 g |
| Sodium diethylenetriamine pentaacetate | 2.0 g |
| 4-amino-N-ethyl-N-(β-methanesulfonamidoethyl) metatoluidine.3/2 sulfate, monohydrate | 5.4 g |
| Fluorescent whitening agent, (a 4,4'-diaminostilbene disulfonic acid derivative) | 1.0 g |
| Potassium hydroxide | 2.0 g |
| Diethylene glycol | 18.0 ml |
| Add water to make the total of | 1 liter |
| Adjust pH to be. | pH 10.35 |
| (Bleach-fixer replenisher) | |
| The same as the foregoing bleach-fixer. | |
| (Stabilizer replenisher) | |
| The same as the foregoing stabilizer. | |

The same as the foregoing stabilizer.

The amounts of the developer, bleach-fixer and stabilizer replenished were each 320 ml per $m^2$ of a subject light sensitive material.

<Results>

| Sample No. | Running variation (Δ DG) DG = 0.3 with fresh solution | Black solidness of letters Visual evaluation |
|---|---|---|
| 1-1 (Comparison) | −0.02 | x |
| 1-2 (Comparison) | +0.06 | o |
| 1-3 (Comparison) | +0.03 | x |
| 1-4 (Invention) | −0.01 | o |
| 1-5 (Invention) | +0.01 | o |
| 1-6 (Invention) | +0.01 | o |
| 1-7 (Invention) | +0.01 | o |

-continued

| Sample No. | <Results> Running variation (Δ DG) DG = 0.3 with fresh solution | Black solidness of letters Visual evaluation |
|---|---|---|
| 1-8 (Comparison) | +0.07 | Δ |
| 1-9 (Invention) | +0.01 | ∘ |
| 1-10 (Invention) | +0.02 | ∘ |
| 1-11 (Invention) | ±0.00 | ∘ |

As is obvious from the results shown above, it can be found that the samples of the invention are stable in image density and excellent in the black solidness in the letter portions, even if they are developed with a running-treated developer.

Example 2

A 110 μm-thick paper support was laminated with polyethylene on one surface thereof and polyethylene containing titanium oxide on the other surface on the layer 1 side. The resulting paper support was coated thereon with each of the layers having the following compositions, so that a multilayered color photographic light sensitive material could be prepared.

(Preparation of Emulsion EM-3)

An aqueous silver nitrate solution and an aqueous potassium bromide solution each having the same mols were added at the same time at 50° C. for 50 minutes in a double-jet process, so that an emulsion comprising regular octahedral silver bromide grains having an average grain size of 0.3 μm could be prepared. To the resulting emulsion, sodium thiosulfate in an amount of 6.5 mg per mol of silver and potassium chloroaurate in an amount of 3 mg per mol of silver were each added. The resulting emulsion was chemically ripened at 70° C. for 70 minutes. Further to the resulting emulsion, an aqueous silver nitrate solution and a mixed solution of sodium bromide and potassium bromide (in a mol ratio of 1:9) were added at the same time, so that a regular octahedral core/shell type emulsion comprising silver bromide cores each having an average grain size of 0.45 μm and silver chlorobromide shells could be prepared. After the resulting emulsion was washed and desalted, it was added with sodium thiosulfate in an amount of 2.0 mg per mol of silver and potassium chloroaurate in an amount of 1.0 mg per mol of silver. The resulting mixture was chemically ripened at 60° C. for 50 minutes, so that direct positive silver halide emulsion EM-3 could be prepared.

(Preparation of Blue-Sensitive Emulsion EM-3B)

Em-3 was added with sensitizing dye D-1 and the resulting mixture was color sensitized. After that, T-1 was added in an amount of 600 mg per mol of silver thereto and, further, foggants FA-1 in an amount of $8\times10^{-5}$ mols per mol of silver and FA-2 in an amount of $5\times10^{-4}$ mols per mol of silver were each added, so that blue-sensitive emulsion EM-3B could be prepared.

FA-1

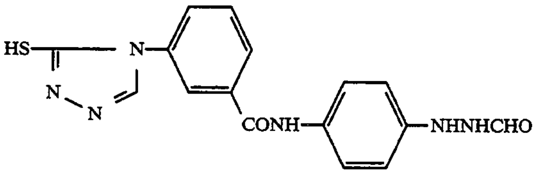

FA-2

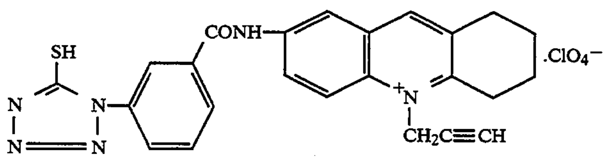

(Preparation of Green-Sensitive Emulsion EM-3G)

Green-sensitive emulsion EM-3G was prepared in the same manner as in the case of the blue-sensitive emulsion, except that sensitizing dye D-2 was added to EM-3 and a color sensitization was carried out.

(Preparation of Red-Sensitive Emulsion EM-3R)

Red-sensitive emulsion EM-3R was prepared in the same manner as in the case of the blue-sensitive emulsion, except that sensitizing dyes D-3 and D-4 were added to EM-3 and a color sensitization was carried out.

(Preparation of Infrared-Sensitive Emulsion EM-3I)

Infrared-sensitive emulsion EM-3I was prepared in the same manner as in the case of the blue-sensitive emulsion, except that sensitizing dye D-5 was added to EM-3 and a color sensitization was carried out.

By making use of the above-mentioned emulsions EM-3B, EM-3G, EM-3R and EM-3I, a color photographic light sensitive material sample 2-1 having the following compositions was prepared. Wherein, layers 1 through 10 were each coated on the surface of the above-mentioned support and layer 11 was coated on the back surface thereof and, further, coating aids SA-1 and SA-2 and layer hardeners H-1 and H-2 were also used.

| Layer | Composition | Amount coated ($g/m^2$) |
|---|---|---|
| Layer 10 | Gelatin | 0.78 |
| (UV absorbing | UV absorbent (UV-1) | 0.065 |
| layer) | UV absorbent (UV-2) | 0.120 |
| | UV absorbent (UV-3) | 0.16 |
| | Solvent (SO-2) | 0.1 |
| | Silica matting agent | 0.03 |
| Layer 9 | Gelatin | 1.05 |
| (Red-sensitive | Infrared-sensitive emulsion EM-3I | |
| layer) | (in silver coated weight) | 0.30 |
| | Yellow coupler (Y-1-3) | 0.21 |
| | Magenta coupler (MC-1) | 0.063 |
| | Cyan coupler (CC-1) | 0.110 |

-continued

| Layer | Composition | Amount coated ($g/m^2$) |
|---|---|---|
| | Antistaining agent (AS-2) | 0.019 |
| | Solvent (SO-3) | 0.615 |
| Layer 8 (Intermediate layer) | Gelatin | 0.75 |
| | Color mixture preventive (AS-1) | 0.055 |
| | Solvent (SO-2) | 0.072 |
| Layer 7 (Blue-sensitive layer) | Gelatin | 1.14 |
| | Blue-sensitive emulsion EM-3B (in silver coated weight) | 0.4 |
| | Yellow coupler (Y-1-3) | 0.656 |
| | Antistaining agent (AS-2) | 0.02 |
| | Solvent (SO-1) | 0.656 |
| | Inhibitors (ST-1, ST-2, T-1) | |
| Layer 6 (Intermediate layer) | Gelatin | 0.75 |
| | Color mixture preventive (AS-1) | 0.055 |
| | Solvent (SO-2) | 0.072 |
| Layer 5 (Green-sentitive layer) | Gelatin | 1.14 |
| | Green-sensitive emulsion EM-3G (in silver coated weight) | 0.40 |
| | Magenta coupler (MC-1) | 0.20 |
| | Antistaining agent (AS-2) | 0.0152 |
| | Solvent (SO-3) | 0.248 |
| | Inhibitors (ST-1, ST-2, T-1) | |
| Layer 4 (Intermediate layer) | Gelatin | 0.75 |
| | Color mixture preventive (AS-1) | 0.055 |
| | Solvent (SO-2) | 0.072 |
| Layer 3 (Red-sensitive layer) | Gelatin | 1.10 |
| | Red-sensitive emulsion EM-3R (in silver coated weight) | 0.24 |
| | Cyan coupler (CC-3) | 0.352 |
| | Solvent (SO-3) | 0.248 |
| | Antistaining agent (AS-2) | 0.012 |
| | Inhibitors (ST-1, ST-2, T-1) | |
| Layer 2 (Intermediate layer) | Gelatin | 0.54 |
| | Color mixture preventive (AS-1) | 0.055 |
| | Solvent (SO-2) | 0.072 |
| Layer 1 (HC layer) | Gelatin | 0.54 |
| | Black colloidal silver layer | 0.08 |
| | Polyvinyl pyrrolidone (PVP) | 0.03 |
| Layer 11 (Back surface layer) | Gelatin | 6.00 |
| | Silica matting agent | 0.65 |

SO-3 Tricresyl phosphate

CC-3

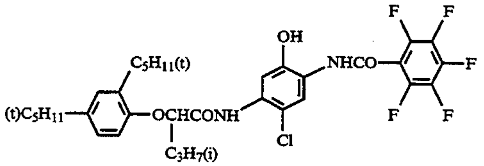

Sample 2-2 was prepared in quite the same manner as in the above-mentioned sample 2-1, except that Layer 1 (HC layer) and Layer 2 (Intermediate layer) were each eliminated from sample 2-2.

Samples 2-3 and 2-4 were each prepared in the same manner as in the above-mentioned Sample 2-1, except that Layer 1 (HC layer) of sample 2-1 was replaced by the following layers coated as Layers 1 of Samples 2-3 and 2-4, respectively.

| | | |
|---|---|---|
| | Sample 2-3 | |
| Layer 1 (White pigment layer) | Gelatin | 1.5 |
| | Anatase type titanium dioxide, (W-10; manufactured by Ishihara Industrial Co., Ltd.) | 4.5 |
| | Sample 2-4 | |
| Layer 1 (White pigment layer) | Gelatin | 0.7 |
| | Anatase type titanium dioxide, (W-10; manufactured by Ishihara Industrial Co., Ltd.) | 1.5 |

One part each of the resulting samples 2-1 through 2-4 was stored under the conditions of 25° C. and 50% RH for 5 days (named Conditions-1) and another one part each of them was stored under the conditions of 50° C. and 80% RH for 5 days (named Conditions-2), respectively.

The stored samples 2-1 through 2-4 were each brought into close contact with a black printer of a halftone dot original document and were then exposed to light under the following exposure conditions-5. Next, they were each brought into close contact with a yellow printer and then exposed to light under the following exposure conditions-6. Further, they were each brought into close contact with a magenta printer and then exposed to light under the following exposure conditions-7. Still further, they were each brought into close contact with a cyan printer and then exposed to light under the following exposure conditions-8.

The resulting exposed light sensitive material samples were each processed in the following processing steps-2, so that halftone dotted dye images could be obtained. The densities of the resulting dye images were measured.

The densities were measured by making use of the same densitometer, Model PD-65 manufactured by Konica Corp., as used in Example 1.

(Exposure conditions-5)

When each of the samples stored under the conditions-1 was exposed to tungsten light through an infrared filter and an ND filter, the density of the ND filter was adjusted so that the exposure could be made for 0.5 seconds in the lowest possible exposure quantity for minimizing the red light density to be obtained after completing the following development process.

(Exposure conditions-6)

When each of the samples stored under the conditions-1 was exposed to tungsten light through a blue filter (Wratten No. 47B) and an ND filter, the density of the ND filter was adjusted so that the exposure could be made for 0.5 seconds in the lowest possible exposure quantity for minimizing the green light density to be obtained after completing the following development process.

(Exposure conditions-7)

When each of the samples stored under the conditions-1 was exposed to tungsten light through a green filter (Wratten No. 58) and an ND filter, the density of the ND filter was adjusted so that the exposure could be made for 0.5 seconds in the lowest possible exposure quantity for minimizing the blue light density to be obtained after completing the following development process.

(Exposure conditions-8)

When each of the samples stored under the conditions-1 was exposed to tungsten light through a red filter (Wratten No. 26) and an ND filter, the density of the ND filter was adjusted so that the exposure could be made for 0.5 seconds in the lowest possible exposure quantity for minimizing the blue light density to be obtained after completing the following development process.

The processing treatments were carried out in accordance with the following processing step. From the resulting images, the difference between conditions-1 for the white background density measured through red light and the conditions-2 was shown in the following table.

| Processing steps-2 | Temperature | Time |
|---|---|---|
| Developing | 37° C. | 130 sec. |
| Bleach-fixing | 35° C. | 45 sec. |
| Stabilizing | 25~30° C. | 90 sec. |
| Drying | 60~85° C. | 40 sec. |

The compositions of the color developer, bleach-fixer, stabilizer and the respective replenishers thereof were the same as those used in processing steps of Example 1.

<Results>

| Sample | Δ DR<br>DR (Conditions-2) − DR (Conditions-1) |
|---|---|
| 2-1 (Comparison) | +0.12 |
| 2-2 (Comparison) | +0.06 |
| 2-3 (Invention) | +0.01 |
| 2-4 (Invention) | +0.02 |

As is obvious from the results shown above, it can be found that the increase in the white background can be limited even if the samples of the invention are stored as they still remain fresh.

Example 3

When Samples 2-1 through 2-4 prepared in Example 2 were each treated in the processing steps-1 of Example 1, it was confirmed that the same effects could be obtained as those obtained in Example 2.

Example 4

A 200 μm-thick paper support was laminated with polyethylene on one surface thereof and polyethylene containing titanium oxide on the other surface on the layer 1 side. The resulting paper support was coated thereon with each of the layers having the following compositions, so that a multilayered color photographic light sensitive material could be prepared. The following layers 1 through 11 were each coated on the front surface of a support and layer 12 was coated on the back surface thereof, so that a multilayered color light sensitive material 3 could be prepared.

The components constituting each of the layers and the coated weights expressed in terms of $g/m^2$ will be given below. Wherein, the amounts of silver halide will be expressed in terms of the silver contents. The silver halides used therein were in the form of silver chlorobromide emulsions (having a mol ratio of AgBr:AgCl=70:30) which were made to be optimum for carrying out the sulfur and gold sensitization. Wherein, The coating aids, SA-1 and SA-2, and the layer hardeners, H-1 and H-2, were each used.

| Layer | Composition | Coated weight ($g/m^2$) |
|---|---|---|
| Layer 11 (Protective layer) | Gelatin | 1.23 |
| Layer 10 (UV absorbing layer) | Gelatin | 0.54 |
| | UV absorbent (UV-1) | 0.40 |
| | Solvent (SO-2) | 0.12 |
| Layer 9 (Panchromatic-sensitive layer) | Gelatin | 1.05 |
| | A 0.30 μm-sized cubic silver chlorobromide emulsion, spectrally sensitized with blue-sensitive sensitizing dye (D-1), green-sensitizing dye (D-2) and red-sensitizing dyes (D-3, D-4) | 0.30 |
| | Yellow coupler (YC-A) | 0.21 |
| | Magenta coupler (MC-1) | 0.063 |
| | Cyan coupler (CC-1) | 0.110 |
| | Antistaining agent (AS-2) | 0.019 |
| | Solvent (SO-1) | 0.615 |
| Layer 8 (Intermediate layer) | Gelatin | 0.75 |
| | Color mixture preventive (AS-1) | 0.055 |
| | Solvent (SO-2) | 0.07 |
| Layer 7 (Red-sensitive layer) | A 0.30 μm-sized cubic silver chlorobromide emulsion, spectrally sensitized with red-sensitizing dyes (D-3, D-4) | 0.22 |
| | Gelatin | 1.38 |
| | Cyan coupler (CC-1) | 0.21 |
| | Cyan coupler (CC-2) | 0.21 |
| | Image stabilizer (AO-3) | 0.22 |
| | Solvent (SO-1) | 0.33 |
| | Dye (AI-2) | 0.02 |
| | Stabilizers (ST-1, ST-2, T-1) | |
| Layer 6 (Intermediate layer) | Gelatin | 0.75 |
| | Color mixture preventive (AS-1) | 0.055 |
| | Oil-soluble dye-4 | 0.0001 |
| | Oil-soluble dye-9 | 0.0001 |
| | Solvent (SO-2) | 0.072 |
| Layer 5 (Green-sensitive layer) | A 0.30 μm-sized cubic silver chlorobromide emulsion, spectrally sensitized with green-sensitizing dyes (D-2) | 0.22 |
| | Gelatin | 1.30 |
| | Magenta coupler (MC-1) | 0.30 |
| | Image stabilizer (AO-1) | 0.24 |
| | Image stabilizer (AO-2) | 0.17 |
| | Solvent (SO-1) | 0.31 |
| | Antistaining agent (AS-2) | 0.015 |
| | Dye (AI-1) | 0.01 |
| | Stabilizers (ST-1, ST-2, T-1) | |
| Layer 4 (Intermediate layer) | Gelatin | 0.75 |
| | Color mixture preventive (AS-1) | 0.055 |
| | Solvent (SO-2) | 0.12 |
| Layer 3 (Blue-sensitive layer) | A 0.55 μm-sized cubic silver chlorobromide emulsion, spectrally sensitized with blue-sensitizing dyes (D-1) | 0.41 |
| | | 0.41 |
| | Gelatin | 1.35 |
| | Yellow coupler (Y-1-3) | 0.84 |
| | Antistaining agent (AS-2) | 0.02 |
| | Image stabilizer (AO-3) | 0.25 |
| | Solvent (SO-1) | 0.52 |
| | Stabilizers (ST-1, ST-2, T-1) | |
| Layer 2 (Intermediate layer) | Gelatin | 0.5 |
| Layer 1 (White pigment layer) | Gelatin | 0.7 |
| | Anatase type titanium dioxide, (W-10; manufactured by Ishihara Industrial Co., Ltd.) | 2.0 |
| Layer 12 | Gelatin | 4.00 |

-continued

| Layer | Composition | Coated weight ($g/m^2$) |
|---|---|---|
| (Back surface layer) | | |

AO-1

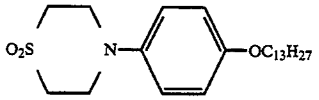

AO-2

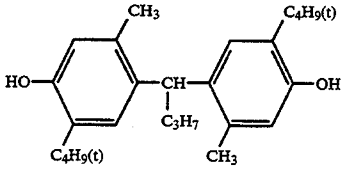

AO-3

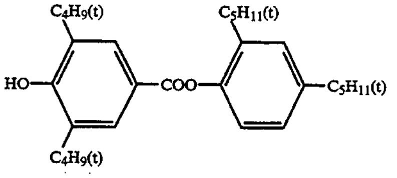

AI-4

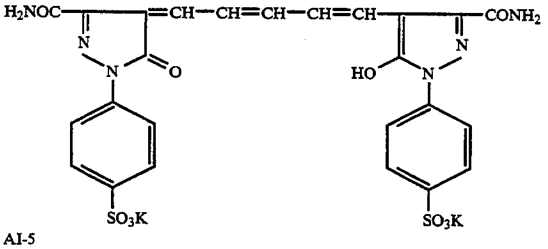

AI-5

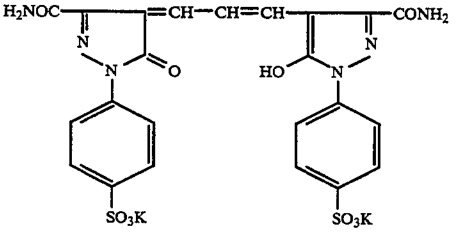

The resulting sample 9 was exposed to a sensitometer through an optical wedge, in an ordinary method. The resulting exposed sample 9 was treated in the processing steps-2 of Example 2. As the result, an image having a solid black background of the fine lines such as letters could be obtained.

Example 5

Samples of the invention, 1-5, 1-10 and 1-11, each prepared in Example 1, were set together in a consensus manufactured by Konica Corp. and they were exposed to light and developed. After that, when treating them for 3 months in a processing ratio of the treated areas of $100m^2$ per month, an excellent image could be resulted.

When making use of the silver halide color photographic light sensitive materials of the invention, the color reproducibility, the reproducibility of fine lines and the image sharpness can be improved, and every replenisher can be replenished in a small amount, or any gradation changes and the color variations of highlight portions can also be improved even if a fatigued developer should be used.

When a color proof is prepared of a halftone dot image information obtained by carrying out a color separation and a halftone dot image conversion by making use of a silver halide color photographic light sensitive material of the invention, any small dot reproducibility deterioration, that may be produced for some reason such as the development conditions, running treatments and fresh sample storage, such deterioration can be improved, so that the color proof of an image having a stable tone can be prepared.

To provide a silver halide color photographic light sensitive material preferably useful for preparing a color image for proofing use (or, a color proof) from plural black-and-white halftone dot images obtained by carrying out a color separation and a halftone dot image conversion in a color plate-making printing step; and the color proof preparation process used therein the above-mentioned light sensitive material.

What is claimed is:

1. A silver halide color photographic light sensitive material comprising:

a reflective support which is both side coated with a polyolefin resin, having thereon a hydrophilic colloidal layer containing a white pigment and a silver halide emulsion layer, wherein the silver halide emulsion layer contains at least one of the compounds represented by the following Formula I, Formula I

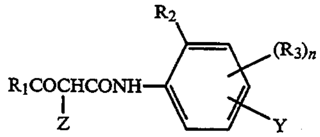

wherein $R_1$ represents an alkyl group, a cycloalkyl group or an aryl group; $R_2$ represents a fluorine atom, an alkyl group, an aryl group, an alkoxy group, an aryloxy group, a dialkylamino group, an alkylthio group or an arylthio group; $R_3$ represents a group substitutable to a benzene ring; n is an integer of 0 or 1; Z represents a hydrogen atom or a group capable of splitting off when coupling it to the oxidized product of a developing agent; and Y represents a monovalent organic group including a ballast group.

2. The silver halide color photographic light sensitive material of claim 1 wherein in the formula I, $R_1$ represents a branched alkyl group, $R_2$ represents an alkoxy group, Z is a group capable of splitting off when making a coupling reaction with an oxidized product of a developing agent and is a group represented by formula II or III, Formula II $$-OR_{10}$$

wherein $R_{10}$ represents an aryl or a heterocyclic group substituted or un-substituted, Formula III

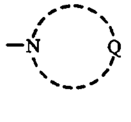

wherein Q represents a group consisting of non-metal atoms necessary to form a 5 or 6 membered ring in association with a nitrogen atom, wherein the non-metal group is selected from the group consisting of methylene, methine, substituted methine, >C=O, —NH—, —O—, —S— and —$SO_2$—.

3. The silver halide color photographic light sensitive material of claim 1 which is used for making a color proof, wherein said material being image-wise exposed and processed, for forming a halftone dot image consisting of yellow, magenta, cyan and black image components, according to color-separated, yellow, magenta, cyan and black image information.

4. The silver halide color photographic light sensitive material of claim 1 wherein the silver halide emulsion layer is a monodisperse type emulsion containing silver halide grains having an average grain size of 0.05 μm to 3 μm.

5. The silver halide photographic light sensitive material of claim 4 wherein a range of a distribution of grain size is not more than 20%.

6. The silver halide color photographic light sensitive material of claim 2 which is used for making a color proof, wherein said material being image-wise exposed and processed, for forming a halftone dot image consisting of yellow, magenta, cyan and black image components, according to color-separated, yellow, magenta, cyan and black image information wherein the silver halide emulsion layers are a yellow image formable silver halide emulsion layer, a magenta image formable silver halide emulsion layer, a cyan image formable silver halide emulsion layer and a black image formable silver halide emulsion layer.

7. The silver halide color photographic light sensitive material of claim 6 wherein the silver halide emulsion layers are monodisperse type emulsions containing silver halide grains having an average grain size of 0.05 μm to 3 μm.

8. The silver halide photographic light sensitive material of claim 7 wherein a range of a distribution of grain size is not more than 20%.

9. The silver halide photographic light sensitive material of claim 1 wherein the white pigment is titanium dioxide and an amount of the white pigment coated is 1 $g/m^2$ to 50 $g/m^2$.

* * * * *